(12) United States Patent
Kim et al.

(10) Patent No.: US 10,756,062 B2
(45) Date of Patent: Aug. 25, 2020

(54) SEMICONDUCTOR CHIP AND SEMICONDUCTOR PACKAGE INCLUDING THE SAME

(71) Applicant: SAMSUNG ELECTRONICS CO., LTD., Suwon-si, Gyeonggi-Do (KR)

(72) Inventors: Kyoung-Soo Kim, Hwaseong-si (KR); Seung-Duk Baek, Hwaseong-si (KR); Sun-Won Kang, Seongnam-si (KR); Ho-Geon Song, Suwon-si (KR); Gun-Ho Chang, Yongin-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 16/359,097

(22) Filed: Mar. 20, 2019

(65) Prior Publication Data
US 2020/0013753 A1   Jan. 9, 2020

(30) Foreign Application Priority Data

Jul. 9, 2018   (KR) .......................... 10-2018-0079578

(51) Int. Cl.
*H01L 23/48* (2006.01)
*H01L 23/52* (2006.01)
(Continued)

(52) U.S. Cl.
CPC ...... *H01L 25/0657* (2013.01); *H01L 23/3128* (2013.01); *H01L 23/481* (2013.01); *H01L 23/49816* (2013.01); *H01L 23/528* (2013.01); *H01L 24/06* (2013.01); *H01L 24/48* (2013.01); *H01L 24/16* (2013.01); *H01L 24/32* (2013.01);
*H01L 24/33* (2013.01); *H01L 24/73* (2013.01); *H01L 2224/04042* (2013.01); *H01L 2224/0557* (2013.01); *H01L 2224/06181* (2013.01); *H01L 2224/13025* (2013.01);
(Continued)

(58) Field of Classification Search
CPC .......... H01L 23/49816; H01L 23/3128; H01L 23/528; H01L 24/48; H01L 24/06; H01L 25/0657
USPC ........................................................ 257/777
See application file for complete search history.

(56) References Cited

U.S. PATENT DOCUMENTS 7,521,793 B2   4/2009 Alhayek et al.
8,243,487 B2   8/2012 Kang et al.
(Continued)

FOREIGN PATENT DOCUMENTS

KR   10-1046253   6/2011

*Primary Examiner* — David S Blum
(74) *Attorney, Agent, or Firm* — F. Chau & Associates, LLC

(57) ABSTRACT

A semiconductor chip includes a semiconductor substrate, a through electrode, an inter-mediation pad, an upper pad, and a rewiring line. The semiconductor substrate includes a first surface that is an active surface and a second surface that is opposite to the first surface. The through electrode penetrates the semiconductor substrate and is disposed in at least one column in a first direction in a center portion of the semiconductor substrate. The inter-mediation pad is disposed in at least one column in the first direction in an edge portion of the second surface. The upper pad is disposed on the second surface and connected to the through electrode. The rewiring line is disposed on the second surface and connects the inter-mediation pad to the upper pad.

20 Claims, 22 Drawing Sheets

(51) Int. Cl.
    *H01L 29/40*     (2006.01)
    *H01L 25/065*     (2006.01)
    *H01L 23/00*     (2006.01)
    *H01L 23/528*     (2006.01)
    *H01L 23/31*     (2006.01)
    *H01L 23/498*     (2006.01)

(52) U.S. Cl.
    CPC ............... *H01L 2224/16227* (2013.01); *H01L 2224/32145* (2013.01); *H01L 2224/32225* (2013.01); *H01L 2224/33181* (2013.01); *H01L 2224/48091* (2013.01); *H01L 2224/48106* (2013.01); *H01L 2224/48145* (2013.01); *H01L 2224/73204* (2013.01); *H01L 2224/73215* (2013.01); *H01L 2224/73257* (2013.01); *H01L 2224/73265* (2013.01); *H01L 2225/06506* (2013.01); *H01L 2225/06517* (2013.01); *H01L 2225/06541* (2013.01); *H01L 2225/06562* (2013.01); *H01L 2225/06565* (2013.01); *H01L 2225/06586* (2013.01); *H01L 2924/1436* (2013.01)

(56) References Cited

U.S. PATENT DOCUMENTS

| | | |
|---|---|---|
| 8,593,847 B2 | 11/2013 | Kim |
| 8,648,429 B2 | 2/2014 | Kang et al. |
| 8,815,643 B2 | 8/2014 | Do et al. |
| 8,884,446 B2 | 11/2014 | Kim et al. |
| 9,324,698 B2 | 4/2016 | Yu et al. |
| 9,633,973 B2 | 4/2017 | Kim et al. |
| 2016/0043059 A1 | 2/2016 | Kim |
| 2016/0141260 A1* | 5/2016 | Chang ............... H01L 24/13 438/613 |
| 2016/0293582 A1 | 10/2016 | Sagiya |
| 2017/0243855 A1 | 8/2017 | Kim |
| 2018/0040592 A1 | 2/2018 | Gandhi et al. |

\* cited by examiner

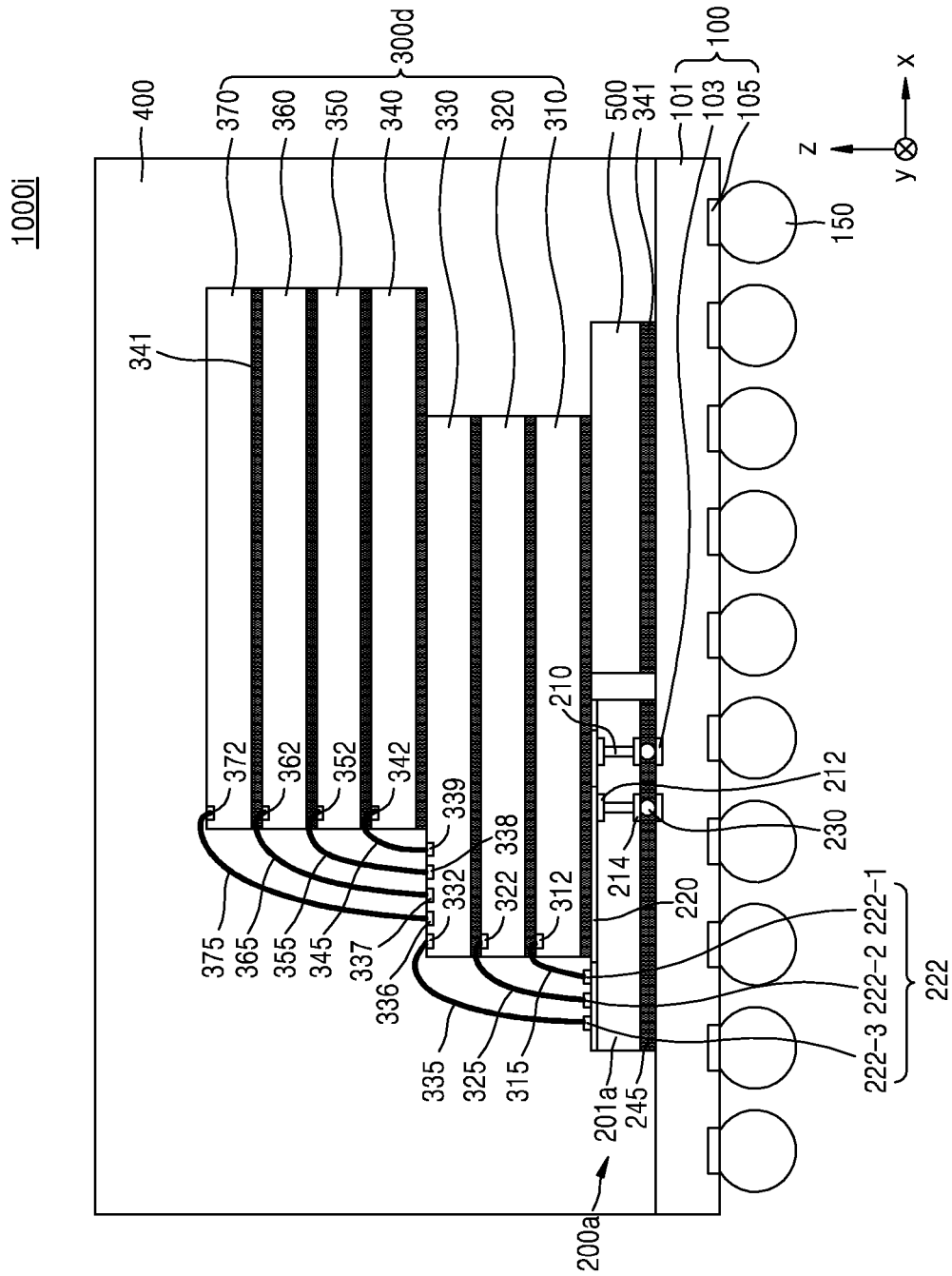

SEMICONDUCTOR CHIP AND SEMICONDUCTOR PACKAGE INCLUDING THE SAME

CROSS-REFERENCE TO RELATED APPLICATIONS

This application claims priority under 35 U.S.C. § 119 to Korean Patent Application No. 10-2018-0079578, filed on Jul. 9, 2018 in the Korean Intellectual Property Office, the disclosure of which is incorporated by reference herein in its entirety.

TECHNICAL FIELD

Exemplary embodiments of the present inventive concept relate to a semiconductor package, and more particularly, to a semiconductor package having a structure in which semiconductor chips are stacked on a printed circuit board (PCB).

DISCUSSION OF THE RELATED ART

As advances are made in electronic devices, electronic devices are becoming smaller and more lightweight. Accordingly, semiconductor packages used in electronic devices must also become smaller and more lightweight, while still maintaining high reliability, high performance and high capacity. A semiconductor chip is typically mounted in a semiconductor package on a printed circuit board (PCB), and is electrically connected to the PCB using a bonding wire or a connection member. When a large capacity is needed, a semiconductor package may utilize a stacked structure in which a plurality of semiconductor chips are stacked and mounted on a PCB.

SUMMARY

Exemplary embodiments of the present inventive concept provide a semiconductor chip having large capacity and capable of maintaining signal characteristics having high speed and high reliability, and a semiconductor package including the semiconductor chip.

According to an exemplary embodiment of the present inventive concept, a semiconductor chip includes a semiconductor substrate, a through electrode, an inter-mediation pad, an upper pad, and a rewiring line. The semiconductor substrate includes a first surface that is an active surface and a second surface that is opposite to the first surface. The through electrode penetrates the semiconductor substrate and is disposed in at least one column in a first direction in a center portion of the semiconductor substrate. The inter-mediation pad is disposed in at least one column in the first direction in an edge portion of the second surface. The upper pad is disposed on the second surface and connected to the through electrode. The rewiring line is disposed on the second surface and connects the inter-mediation pad to the upper pad.

According to an exemplary embodiment of the present inventive concept, a semiconductor package includes a package substrate, an external connection terminal disposed on a bottom surface of the package substrate, and a first semiconductor chip disposed on the package substrate. The first semiconductor chip includes a first surface that is an active surface and a second surface opposite to the first surface. The first semiconductor chip includes a through electrode disposed in a center portion of the first semiconductor chip, and an inter-mediation pad disposed in an edge portion of the second surface of the first semiconductor chip. The semiconductor package further includes at least one second semiconductor chip disposed on the first semiconductor chip. The at least one second semiconductor chip includes an active surface that faces a same direction as the second surface of the first semiconductor chip, and a chip pad disposed on the active surface of the at least one second semiconductor chip. The inter-mediation pad is exposed. The semiconductor package further includes a rewiring line disposed on the second surface of the first semiconductor chip. The chip pad is connected to the inter-mediation pad through a wire, the inter-mediation pad is connected to the through electrode through the rewiring line, and the through electrode is connected to the external connection terminal.

According to an exemplary embodiment of the present inventive concept, a semiconductor package includes a package substrate and a first semiconductor chip disposed on the package substrate. An active surface of the first semiconductor chip is connected to the package substrate through a through electrode. The semiconductor package further includes at least one second semiconductor chip disposed on the first semiconductor chip. An inactive surface of the at least one second semiconductor chip faces the first semiconductor chip, and the at least one second semiconductor chip is connected to the first semiconductor chip through wire bonding.

According to an exemplary embodiment of the present inventive concept, a semiconductor package includes a package substrate and a first semiconductor chip disposed on the package substrate. The first semiconductor chip includes a through electrode disposed in a center portion of the first semiconductor chip, and an inter-mediation pad disposed on an inactive surface of the first semiconductor chip in an edge portion of the first semiconductor chip. The semiconductor package further includes at least one second semiconductor chip disposed on the first semiconductor chip and including a chip pad disposed on an active surface of the at least one second semiconductor chip in an edge portion of the at least one second semiconductor chip. The active surface of the at least one second semiconductor chip faces a same direction as the inactive surface of the first semiconductor chip, and the inter-mediation pad is exposed. The semiconductor package further includes a sealing material sealing the first semiconductor chip and the at least one second semiconductor chip.

BRIEF DESCRIPTION OF THE DRAWINGS

The above and other features of the present inventive concept will become more apparent by describing in detail exemplary embodiments thereof with reference to the accompanying drawings, in which:

FIGS. 10 through 12 are cross-sectional views of semiconductor packages according to exemplary embodiments of the present inventive concept.

DETAILED DESCRIPTION OF THE EXEMPLARY EMBODIMENTS

Figure 1A:
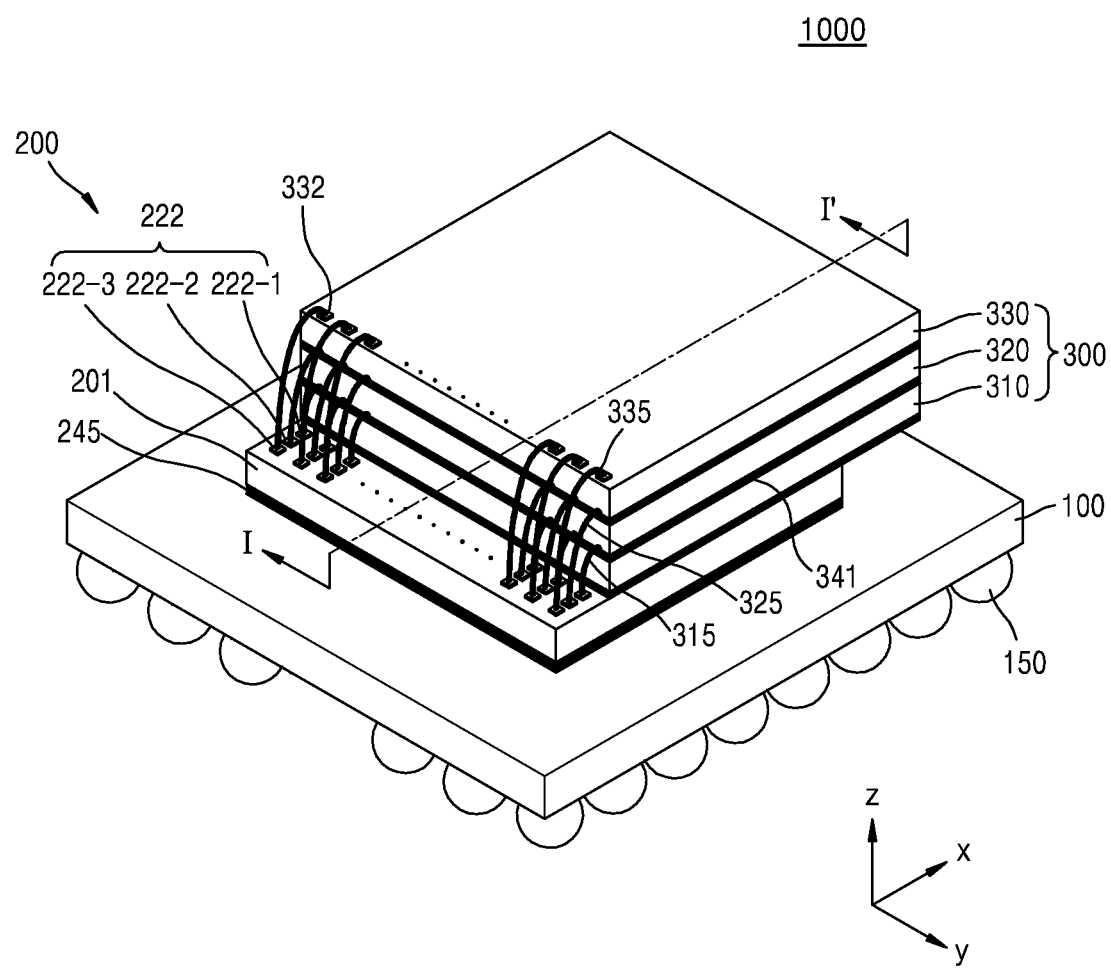
FIG. 1A is a perspective view of a semiconductor package according to an exemplary embodiment of the present inventive concept.

Exemplary embodiments of the present inventive concept will be described more fully hereinafter with reference to accompanying drawings. Like reference numerals may refer to like elements throughout the accompanying drawings.

Figure 1B:
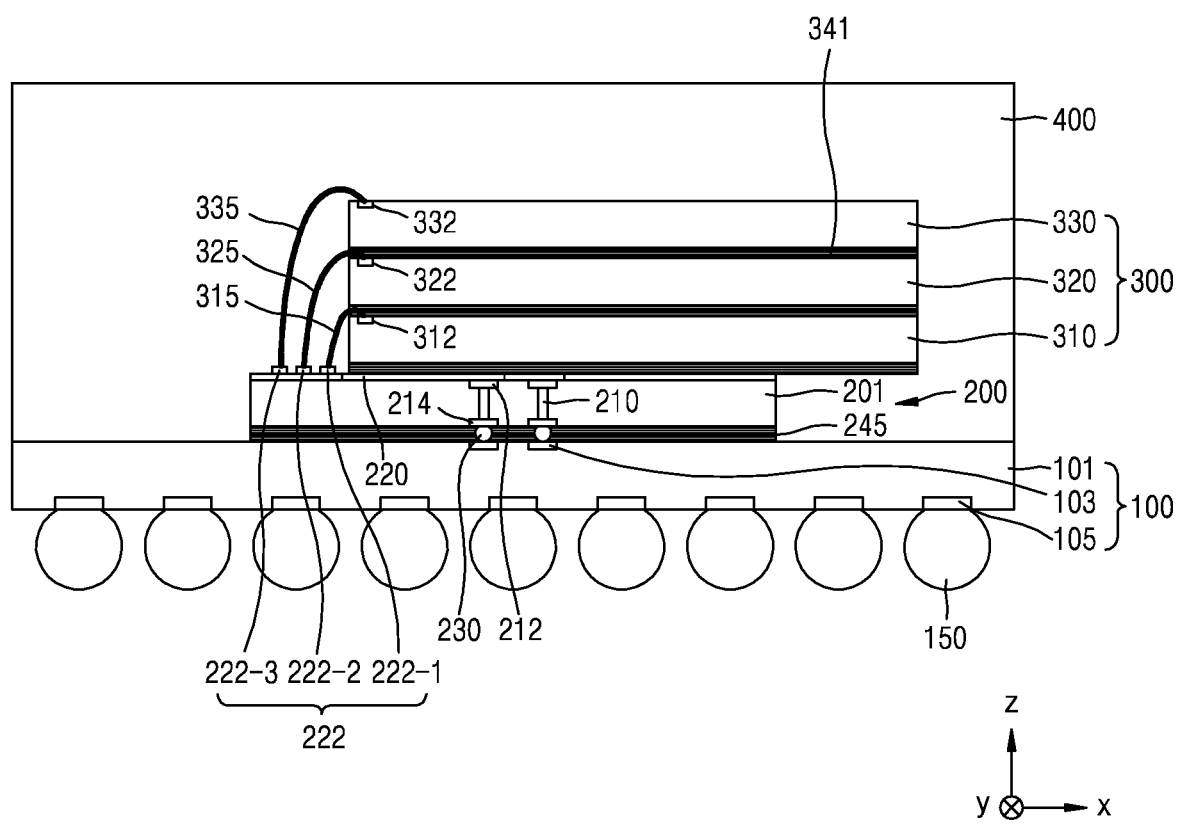
FIG. 1B is a cross-sectional view taken along line I-I of FIG. 1A.

FIG. 1A is a perspective view of a semiconductor package 1000 according to an exemplary embodiment of the present inventive concept. FIG. 1B is a cross-sectional view taken along line I-I of FIG. 1A. In FIG. 1A, for convenience of illustration, a sealing material is not shown.

Referring to FIGS. 1A and 1B, the semiconductor package 1000 according to an exemplary embodiment may include a package substrate 100, a first semiconductor chip 200, a stacked chip group 300, and a sealing material 400.

The package substrate 100 may include a body layer 101, an upper substrate pad 103, and a lower substrate pad 105. The body layer 101 may be formed of any one of various materials. For example, the body layer 101 may be formed of silicon, ceramic, an organic material, glass, epoxy resin, etc., according to a type of the package substrate 100. In the semiconductor package 1000 according to an exemplary embodiment, the package substrate 100 may include an epoxy resin-based printed circuit board (PCB). A single layer or multilayer of wirings may be formed in the body layer 101. The upper substrate pad 103 and the lower substrate pad 105 may be electrically connected to each other through the wirings.

The upper substrate pad 103 may be formed on a top surface of the body layer 101 and connected to the wirings of the body layer 101. A connection member 230 of the first semiconductor chip 200 may be disposed on the upper substrate pad 103. The lower substrate pad 105 may be formed on a bottom surface of the body layer 101 and connected to the wirings of the body layer 101. An external connection terminal 150 may be disposed on the lower substrate pad 105. A protection layer that covers the wirings may be formed on the top and bottom surfaces of the body layer 101, and the upper substrate pad 103 and the lower substrate pad 105 may be exposed through the protection layer.

The external connection terminal 150 may be disposed on a bottom surface of the package substrate 100. The external connection terminal 150 may include, for example, a solder ball. The external connection terminal 150 may include a data signal (DQ) external connection terminal (for example, a DQ external connection terminal 150D of FIG. 4A), a command and address signal (C/A) external connection terminal (for example, a C/A external connection terminal 150C of FIG. 4A), a power/ground (P/G) external connection terminal, etc. The DQ external connection terminal and the C/A external connection terminal may be disposed in different regions on the bottom surface of the package substrate 100 (see, e.g., FIG. 4A). The P/G external connection terminal may be randomly disposed between the DQ external connection terminals and between the C/A external connection terminals on the bottom surface of the package substrate 100.

The first semiconductor chip 200 may include a chip body layer 201, a through electrode 210, a rewiring line 220, and the connection member 230. The first semiconductor chip 200 may be stacked on the package substrate 100 such that a front-side (for example, a front-side Sf of FIG. 2B) that is an active surface faces the package substrate 100, and may be mounted on the package substrate 100 through the connection member 230 and an underfill 245. The underfill 245 may include, for example, a non-conductive film (NCF). However, a material of the underfill 245 is not limited thereto.

Figure 3A:
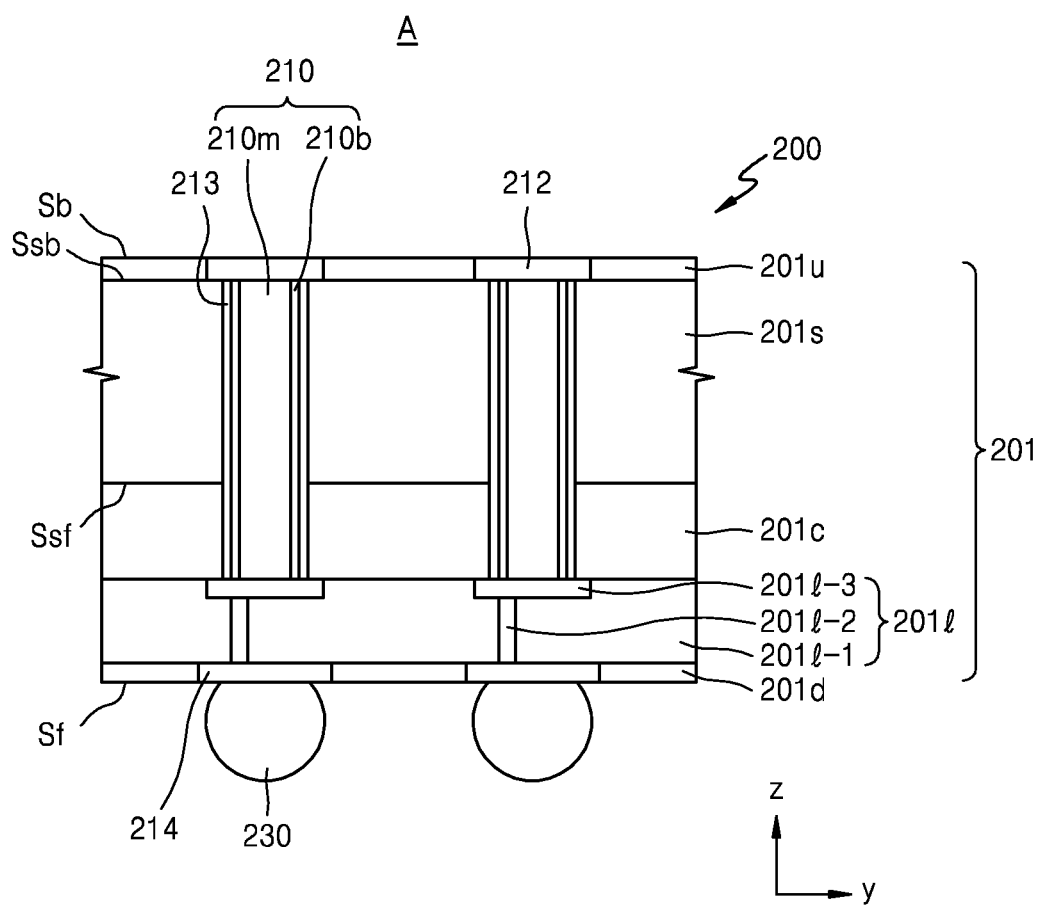
FIGS. 3A and 3B are enlarged cross-sectional views of region A of FIG. 2B.

The chip body layer 201 may include a semiconductor substrate (for example, a semiconductor substrate 201s of FIG. 3A), a circuit layer (for example, a circuit layer 201c of FIG. 3A), and a wiring layer (for example, a wiring layer 201l of FIG. 3A). The through electrode 210 may penetrate at least a part of the chip body layer 201 and may be disposed in a center portion of the first semiconductor chip 200 in a second direction (y direction). The through electrode 210 may be disposed in two columns in the second direction (y direction). For example, the through electrode 210 may include two parts disposed adjacent to one another in a center portion of the first semiconductor chip 200. However, a location at which the through electrode 210 is disposed is not limited to the center portion. Also, the number of columns of the through electrode 210 is not limited to two. For example, the location of the through electrode 210 and the number of columns of the through electrode 210 may be varied to affect the length of wiring (for example, wiring 130 of FIG. 4B) to the external connection terminal 150 divided into regions as described below as desired. An upper portion of the through electrode 210 may be connected to an upper pad 212, and a lower portion of the through electrode 210 may be connected to a lower pad 214. The through electrode 210 may penetrate a silicon substrate, and thus may be referred to as a through silicon via (TSV).

Herein, when an element is described as being disposed in a number of columns in a certain direction, it is to be understood that the element includes a number of portions corresponding to the number of columns and disposed in the certain direction. For example, referring to FIGS. 2B and 3A, it can be seen that in an exemplary embodiment, the through electrode 210 is disposed in two columns in the second direction (y direction) (e.g., the through electrode 210 includes two portions disposed in the second direction (y direction)).

Figure 2A:
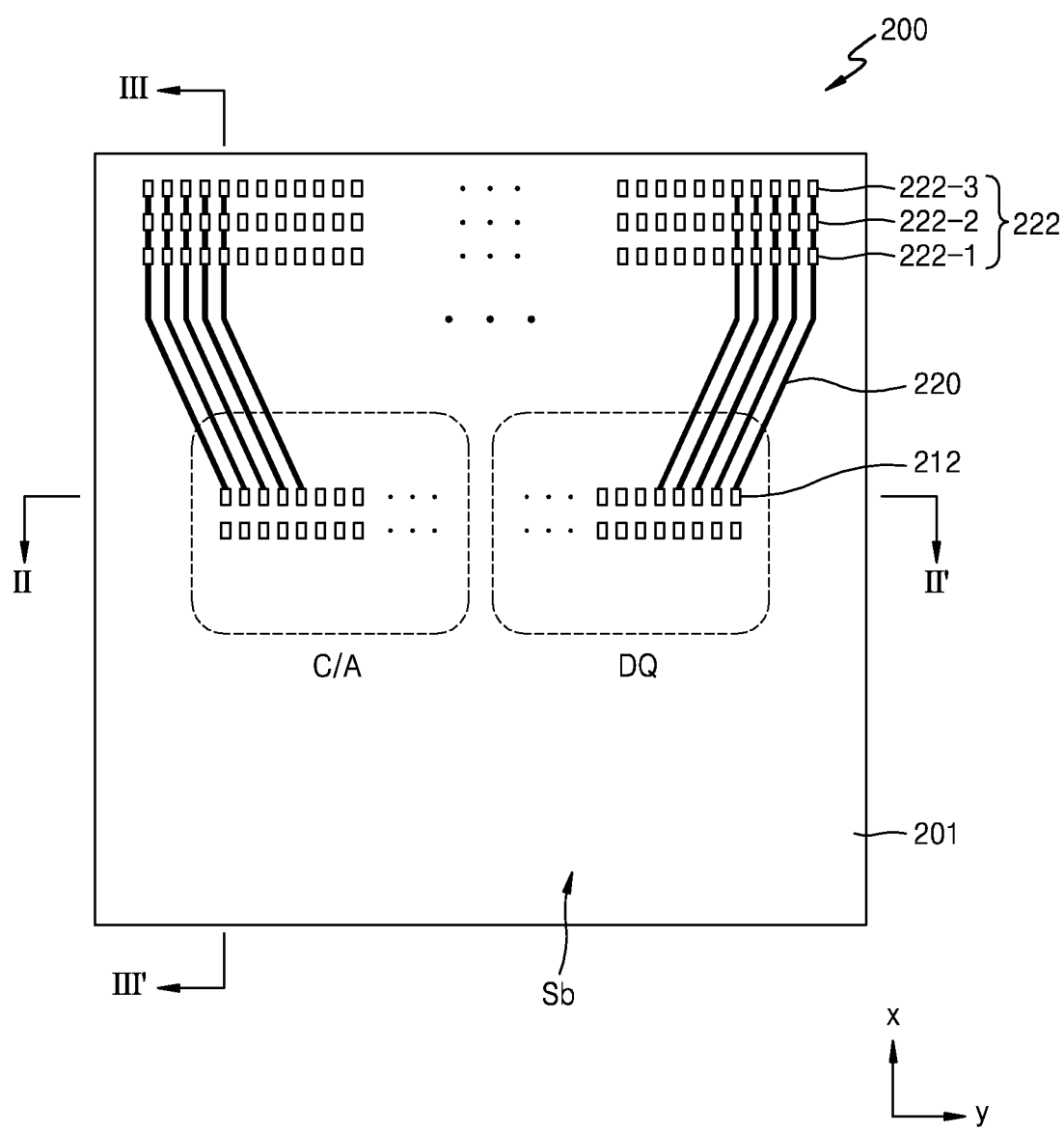
FIG. 2A is a top view of a first semiconductor chip in the semiconductor package of FIG. 1A.

An inter-mediation pad 222 may be disposed in an edge portion of a back-side (for example, a back-side Sb of FIG. 2B) that is an inactive surface of the first semiconductor chip 200, and the upper pad 212 may be disposed in a center portion of the back-side. The inter-mediation pad 222 may be disposed in the second direction (y direction) and may be disposed in three columns, as shown in FIG. 2A. The number of columns of the inter-mediation pad 222 may correspond to, for example, the number of second semiconductor chips 310, 320, and 330 stacked on the first semiconductor chip 200. The upper pad 212 may be disposed in the second direction (y direction) in two columns, as shown in FIG. 2A. For example, the number of columns of the upper pad 212 may correspond to the number of columns of the through electrode 210 formed in the first semiconductor chip 200. However, according to an exemplary embodiment, the number of columns of the upper pad 212 and the number of columns of the through electrode 210 may be different from each other.

As shown in FIG. 2A, in an exemplary embodiment, a region in which the inter-mediation pad 222 is disposed may be divided into a first region and a second region, and a region in which the upper pad 212 is disposed may be divided into a third region corresponding to the first region and a fourth region corresponding to the second region. The inter-mediation pad 222 in the first region may be connected to the upper pad 212 in the third region through the rewiring line 220, and the inter-mediation pad 222 in the second region may be connected to the upper pad 212 in the fourth region through the rewiring line 220. The inter-mediation pad 222 disposed in the first region may be configured to communicate a data signal (as indicated by DQ denoting the third region in FIG. 2A), and the inter-mediation pad 222 disposed in the second region may be configured to communicate a command and address signal (as indicated by C/A denoting the fourth region in FIG. 2A).

In an exemplary embodiment, the through electrode 210 is disposed in a center portion of the first semiconductor chip 200, and the inter-mediation pad 222 is disposed in an edge portion of the first semiconductor chip 200. In such an exemplary embodiment, referring to the inter-mediation pad 222 and the through electrode 210, the inter-mediation pad 222 is disposed closer to an edge of the semiconductor chip 200 (see, e.g., FIGS. 2A and 2C).

The rewiring line 220 may be disposed on the back-side of the first semiconductor chip 200, and may electrically connect the inter-mediation pad 222 to the upper pad 212. Accordingly, the inter-mediation pad 222 may be electrically connected to the connection member 230 through the rewiring line 220, the upper pad 212, and the through electrode 210, and ultimately, electrically connected to the external connection terminal 150 of the package substrate 100.

When the first semiconductor chip 200 has the above-described structure, a wiring structure of the package substrate 100, which connects the second semiconductor chips 310, 320 and 330 to the external connection terminal 150 of the package substrate 100, may be short and balanced. Accordingly, the semiconductor package 1000 according to an exemplary embodiment may reduce a signal failure or signal delay caused by a loading effect of parasitic capacitance of the package substrate 100, and/or reduce an imbalance or increase in wiring connection.

A detailed structure of the first semiconductor chip 200 will be described further with reference to FIGS. 2A through 3B. A wiring connection relationship from the first semiconductor chip 200 to the external connection terminal 150 of the package substrate 100 will be described in detail with reference to FIGS. 4A and 4B.

Referring still to FIGS. 1A and 1B, the stacked chip group 300 is stacked on the first semiconductor chip 200, and may be mounted through an adhesive member 341 and first through third wires 315, 325, and 335. The adhesive member 341 may include, for example, a die attach film (DAF). However, the adhesive member 341 is not limited to a DAF. The stacked chip group 300 may include the three second semiconductor chips 310, 320 and 330, which may include, for example, a bottom second semiconductor chip 310, a middle second semiconductor chip 320, and a top second semiconductor chip 330. However, the number of second semiconductor chips included in the stacked chip group 300 is not limited to three. For example, in an exemplary embodiment, the stacked chip group 300 may include more or less than three second semiconductor chips.

The second semiconductor chips 310, 320 and 330 may be electrically connected to the first semiconductor chip 200 through wire bonding. Accordingly, front-sides of the second semiconductor chips 310, 320 and 330, which are active surfaces, may face upward, and first through third chip pads 312, 322 and 332 may be respectively disposed on the front-sides of the second semiconductor chips 310, 320 and 330. The first through third chip pads 312, 322, and 332 of the second semiconductor chips 310, 320 and 330 may be electrically connected to the inter-mediation pad 222 of the first semiconductor chip 200 through the first through third wires 315, 325 and 335. For example, the first chip pad 312 of the bottom second semiconductor chip 310 may be connected to a first inter-mediation pad 222-1 provided innermost in a first direction (x direction) through the first wire 315, the second chip pad 322 of the middle second semiconductor chip 320 may be connected to a second inter-mediation pad 222-2 provided in the middle in the first direction (x direction) through the second wire 325, and the third chip pad 332 of the top second semiconductor chip 330 may be connected to a third inter-mediation pad 222-3 located outermost in the first direction (x direction) through the third wire 335.

The first through third chip pads 312, 322 and 332 may include a DQ chip pad and a C/A chip pad. According to an exemplary embodiment, the first through third chip pads 312, 322 and 332 may include a P/G chip pad. For example, the P/G chip pad may be disposed at an edge portion of the second semiconductor chips 310, 320 and 330, at a location at which the DQ chip pad and the C/A chip pad are disposed. However, exemplary embodiments are not limited thereto. For example, in an exemplary embodiment, the P/G chip pad may be disposed at an edge portion different from that of the second semiconductor chips 310, 320 and 330, at a location at which the DQ chip pad and the C/A chip pad are disposed. The P/G chip pad may be directly connected to a P/G substrate pad of the package substrate 100 through a wire without passing through the first semiconductor chip 200. Hereinafter, an exemplary embodiment in which the first through third chip pads 312, 322 and 332 include the DQ chip pad and the C/A chip pad is described.

As shown in FIGS. 1A and 1B, the first semiconductor chip 200 may have the same size and shape as the second semiconductor chips 310, 320 and 330. However, exemplary embodiments are not limited thereto. For example, according to an exemplary embodiment, the first semiconductor chip 200 may have a different size than the second semiconductor chips 310, 320 and 330. An exemplary embodiment in which the first semiconductor chip 200 has a different size than the second semiconductor chips 310, 320 and 330 will be described in detail later with reference to FIGS. 7A through 7D.

The sealing material 400 may protect the first semiconductor chip 200 and the stacked chip group 300 from external physical and electrical impacts by sealing the first semiconductor chip 200 and the stacked chip group 300. In the semiconductor package 1000 according to an exemplary embodiment, the sealing material 400 may cover side surfaces of the first semiconductor chip 200 and the stacked chip group 300, side surfaces of the underfill 245 and the adhesive member 341, and a top surface of the top second semiconductor chip 330. The sealing material 400 may be formed of a polymer such as, for example, resin. For example, the sealing material 400 may be formed of an epoxy molding compound (EMC). According to an exemplary embodiment, when the sealing material 400 is formed via a molded underfill (MUF) process, the sealing material 400 may be filled between the first semiconductor chip 200 and the package substrate 100, instead of the underfill 245.

In the semiconductor package 1000 according to an exemplary embodiment, the first semiconductor chip 200 may be a master chip, and the stacked chip group 300 and the second semiconductor chips 310, 320 and 330 may be slave chips. The master chip and the slave chip will be described in detail later with reference to FIGS. 5A and 5B.

In the semiconductor package 1000 according to an exemplary embodiment, the first semiconductor chip 200 that is a master chip may be mounted on the package substrate 100 through the connection member 230, and the second semiconductor chips 310, 320 and 330 that are slave chips may be mounted on the first semiconductor chip 200 through the first through third wires 315, 325 and 335. The second semiconductor chips 310, 320 and 330 may be connected to the through electrode 210 disposed in the center portion of the first semiconductor chip 200 through the first through third wires 315, 325 and 335, the inter-mediation pad 222, the rewiring line 220, and the upper pad 212 of the first semiconductor chip 200, and may be connected to the package substrate 100 through the connection member 230.

Accordingly, in the semiconductor package 1000 according to an exemplary embodiment, the second semiconductor chips 310, 320 and 330 are electrically connected to the external connection terminal 150 disposed on the bottom surface of the package substrate 100 by using the first semiconductor chip 200, and the wiring connection to the DQ external connection terminal and the C/A external connection terminal based on the first semiconductor chip 200 is short and balanced. Thus, a signal delay phenomenon and a loading phenomenon caused by capacitance may be largely improved. As a result, the semiconductor package 1000 according to an exemplary embodiment may implement an electronic apparatus or electronic system that operates at a high speed and has an effective high signal integrity (SI) characteristic.

Figure 2B:
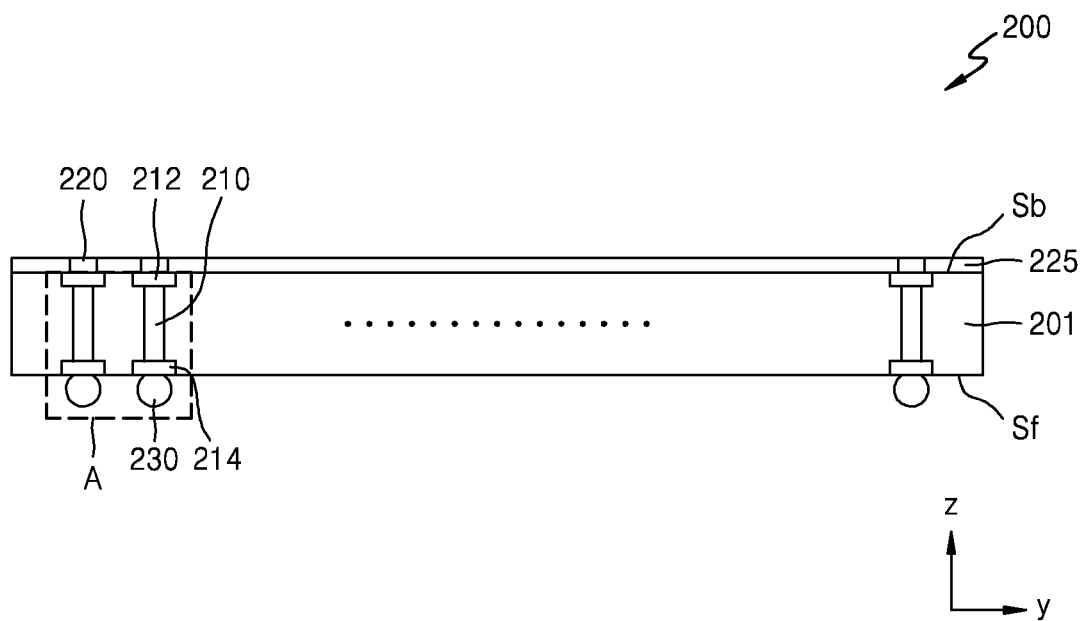
FIGS. 2B and 2C are cross-sectional views respectively taken along lines II-II' and III-III' of FIG. 2A.
Figure 2C:
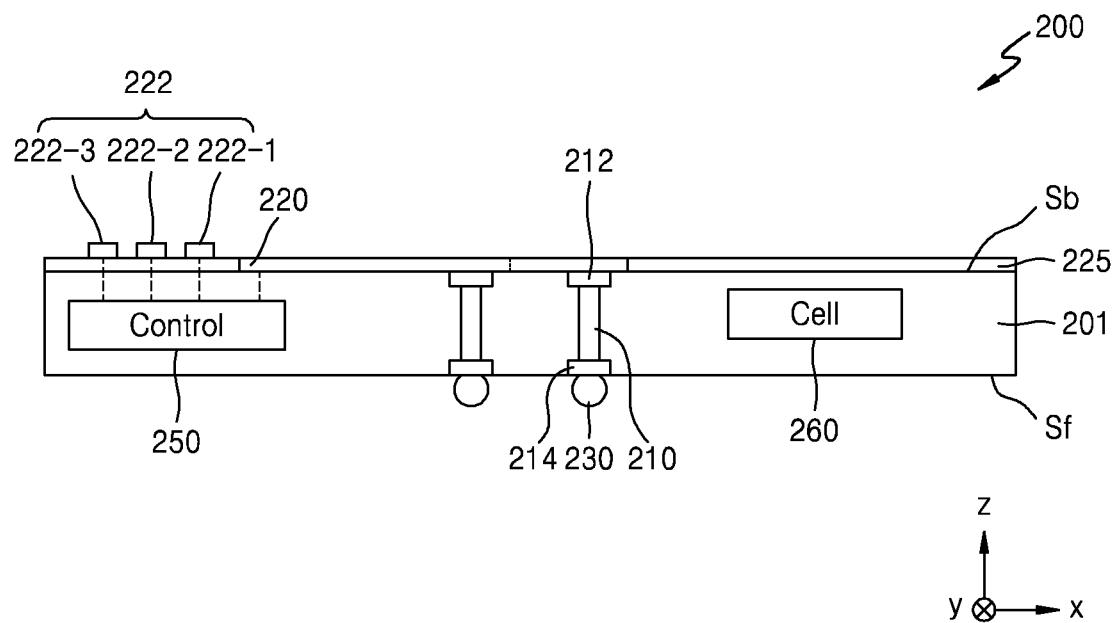

FIG. 2A is a top view of the first semiconductor chip 200 in the semiconductor package 1000 of FIG. 1A. FIGS. 2B and 2C are cross-sectional views respectively taken along lines II-II' and III-III' of FIG. 2A.

Referring to FIGS. 2A through 2C, the upper pad 212, the inter-mediation pad 222, and the rewiring line 220 may be disposed on the back-side Sb of the first semiconductor chip 200.

The upper pad 212 may be formed on the through electrode 210. The upper pad 212 may be disposed in a center portion of the back-side Sb of the first semiconductor chip 200 in the second direction (y direction) and disposed in two columns. The inter-mediation pad 222 may be disposed in an edge portion of the back-side Sb of the first semiconductor chip 200 in the second direction (y direction) in three columns. For example, the inter-mediation pad 222 may include three pads disposed adjacent to one another in an edge portion of the back-side Sb of the first semiconductor chip 200. As shown in FIG. 2A, the upper pad 212 may be one of a plurality of upper pads 212, and the upper pads 212 may be divided into a plurality of C/A upper pads and a plurality of DQ upper pads based on regions. In FIG. 2A, a region of the C/A upper pad and a region of the DQ upper pad are denoted by dashed lines. The inter-mediation pad 222 may also be one of a plurality of inter-mediation pads 222, and the inter-mediation pads 222 may be divided into a plurality of C/A inter-mediation pads and a plurality of DQ inter-mediation pads according to regions, in accordance with the upper pads 212.

Figure 5A:
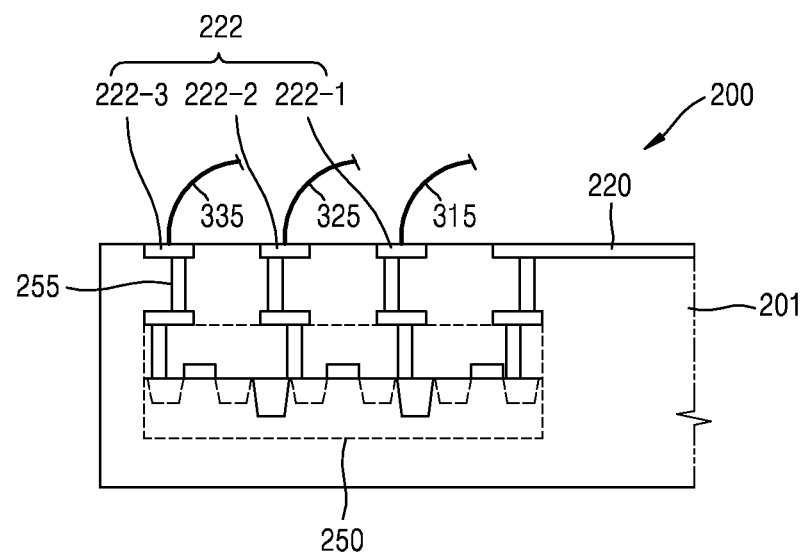
FIG. 5A is a cross-sectional view illustrating in detail a structure in which an inter-mediation pad and a rewiring line are connected to each other through a control region in the first semiconductor chip of FIG. 2C.

In FIG. 2A, the rewiring line 220 is illustrated as if it is directly connected to the inter-mediation pad 222. However, exemplary embodiments are not limited thereto, and such a connection may be a conceptual electrical connection. For example, in an exemplary embodiment, the rewiring line 220 and the inter-mediation pad 222 may be connected to each other through a control region 250 disposed in the chip body layer 201, as shown in FIG. 2C or 5A. The rewiring line 220 may be connected to the upper pad 212. In FIG. 2A, for convenience of illustration, the upper pad 212 of the first column close to the inter-mediation pad 222 is connected to the inter-mediation pad 222 through the rewiring line 220, however, it is to be understood that the upper pad 212 of the second column may also be connected to the inter-mediation pad 222 through the rewiring line 220. In FIG. 2C, the rewiring lines 220 connected to the two upper pads 212 are illustrated by dashed lines. The rewiring line 220 may be covered by a passivation layer 225 provided on the chip body layer 201.

The through electrode 210 may penetrate at least a part of the chip body layer 201. An upper portion of the through electrode 210 may be connected to the upper pad 212, and a lower portion of the through electrode 210 may be connected to the lower pad 214. The connection member 230 may be disposed on the lower pad 214. The connection member 230 may include a micro bump. According to an exemplary embodiment, the connection member 230 may include a metal filler and a micro bump. The through electrode 210 may be disposed in two columns in the second direction (y direction). For example, the through electrode 210 may include two parts in the second direction (y direction). However, exemplary embodiments are not limited thereto. For example, in an exemplary embodiment, the through electrode 210 may be disposed in one column or at least three columns. A detailed structure of the through electrode 210 will be described further with reference to FIGS. 3A and 3B.

The first semiconductor chip 200 may include the control region 250 and a cell region 260 in the chip body layer 201. Control devices may be disposed in the control region 250 and memory devices may be disposed in the cell region 260. For example, dynamic random-access memory (DRAM) devices may be disposed in the cell region 260. However, a type of memory devices disposed in the cell region 260 is not limited to DRAM devices. According to an exemplary embodiment, the first semiconductor chip 200 may include only the control region 250, as shown in FIG. 7D.

Figure 3B:
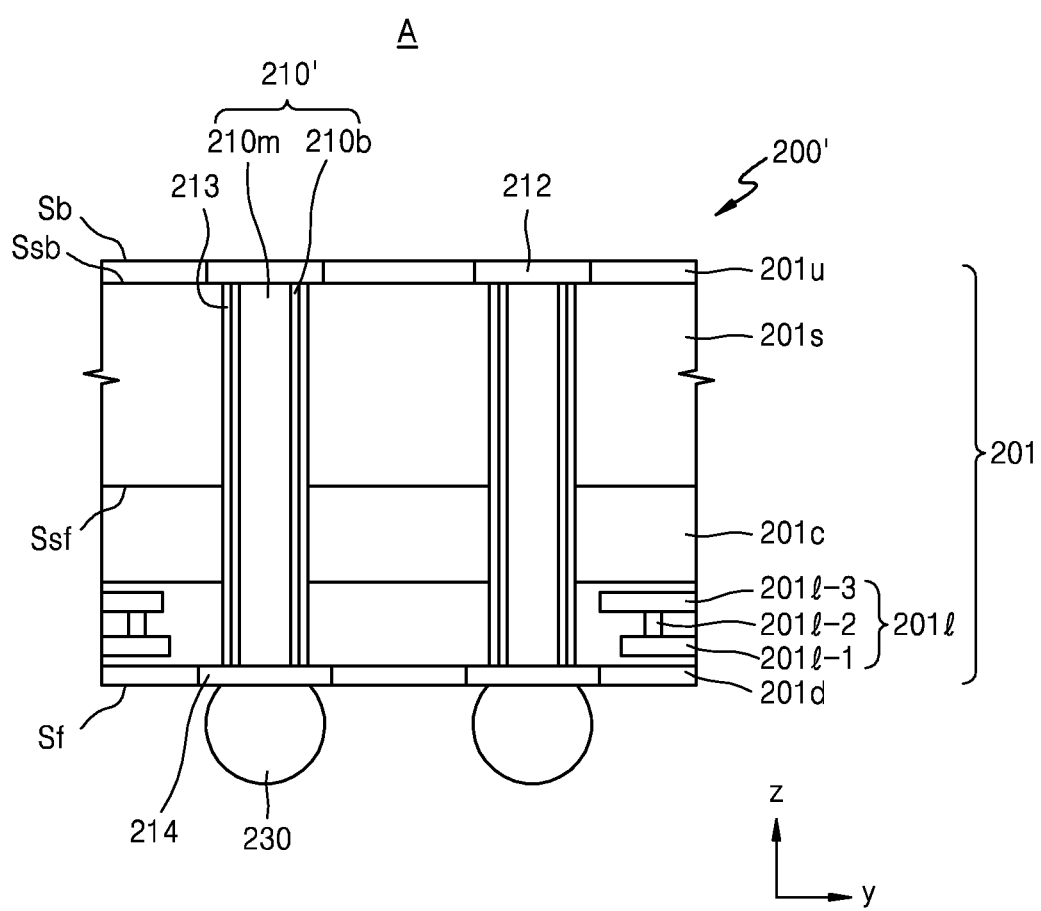

FIGS. 3A and 3B are enlarged cross-sectional views of region A of FIG. 2B.

Referring to FIG. 3A, the chip body layer 201 of the first semiconductor chip 200 may include the semiconductor substrate 201s, the circuit layer 201c, the wiring layer 201l, an upper protection layer 201u, and a lower protection layer 201d.

The semiconductor substrate 201s may include a semiconductor material such as, for example, a Group IV material or a Group III-V compound. In the first semiconductor chip 200 according to an exemplary embodiment, the semiconductor substrate 201s may include a silicon substrate. The semiconductor substrate 201s may include a first surface Ssf that is an active surface, and a second surface Ssb that is an inactive surface. In the above description of the first semiconductor chip 200, an outer surface facing the same direction as the first surface Ssf has been referred to as the front-side Sf, and an outer surface facing the same direction as the second surface Ssb has been referred to as the back-side Sb.

The circuit layer 201c may be disposed on the first surface Ssf of the semiconductor substrate 201s. A plurality of circuit devices such as, for example, a transistor, may be included in the circuit layer 201c. The type of a semiconductor chip may be determined according to circuit devices included in the circuit layer 201c. For example, in the semiconductor package 1000 according to an exemplary embodiment, DRAM devices and control devices may be included in the circuit layer 201c of the first semiconductor chip 200. However, exemplary embodiments are not limited thereto. For example, in an exemplary embodiment, only control devices may be included in the circuit layer 201c of the first semiconductor chip 200.

The wiring layer 201l may be disposed on a bottom surface of the circuit layer 201c, and may include an inter-metal insulating layer 201l-1, wiring 201l-3, and a vertical plug 201l-2. The wiring 201l-3 may be formed as at least one layer in the inter-metal insulating layer 201l-1. The wiring 201l-3 may be electrically connected to circuit devices in the circuit layer 201c, and electrically connected to the lower pad 214 on a bottom surface of the wiring layer 201l. The vertical plug 201l-2 may connect the wirings 201l-3 of different layers or connect the wiring 201l-3 to the lower pad 214.

The through electrode 210 may penetrate the semiconductor substrate 201s and the circuit layer 201c. The through electrode 210 may include a wiring metal layer 210m in a center region of the through electrode 210 and a barrier metal layer 210b in an outer region (e.g., disposed adjacent to the wiring metal layer 210m). The wiring metal layer 210m may include, for example, at least one metal selected from tungsten (W), aluminum (Al), and copper (Cu). The barrier metal layer 210b may include at least one metal selected from, for example, titanium (Ti), tantalum (Ta), titanium nitride (TiN), and tantalum nitride (TaN). However, materials of the wiring metal layer 210m and barrier metal layer 210b are not limited thereto.

A spacer insulating layer 213 may be disposed between the through electrode 210 and the semiconductor substrate 201s, and between the through electrode 210 and the circuit layer 201c. The spacer insulating layer 213 may prevent the semiconductor substrate 201s and the circuit devices in the circuit layer 201c from directly contacting the through electrode 210.

In the semiconductor package 1000 according to an exemplary embodiment, the through electrode 210 may have a via-middle structure, such as in the exemplary embodiment of FIG. 3A. For example, the through electrode 210 may be classified having a via-first structure, a via-middle structure, and a via-last structure. The via-first structure denotes a structure in which a through electrode is formed before the circuit layer 201c is formed, the via-middle structure denotes a structure in which a through electrode is formed after the circuit layer 201c is formed and before the wiring layer 201l is formed, and the via-last structure denotes a structure in which a through electrode is formed after the wiring layer 201l is formed.

Referring to FIG. 3B, a first semiconductor chip 200' according to an exemplary embodiment may be different from the first semiconductor chip 200 of FIG. 3A in that a through electrode 210' has a via-last structure. Accordingly, in the first semiconductor chip 200' according to the exemplary embodiment of FIG. 3B, the through electrode 210' may penetrate the circuit layer 201c and the wiring layer 201l, and the through electrode 210' may be directly connected to the lower pad 214 without being relayed by the wiring layer 201l.

Figure 4A:
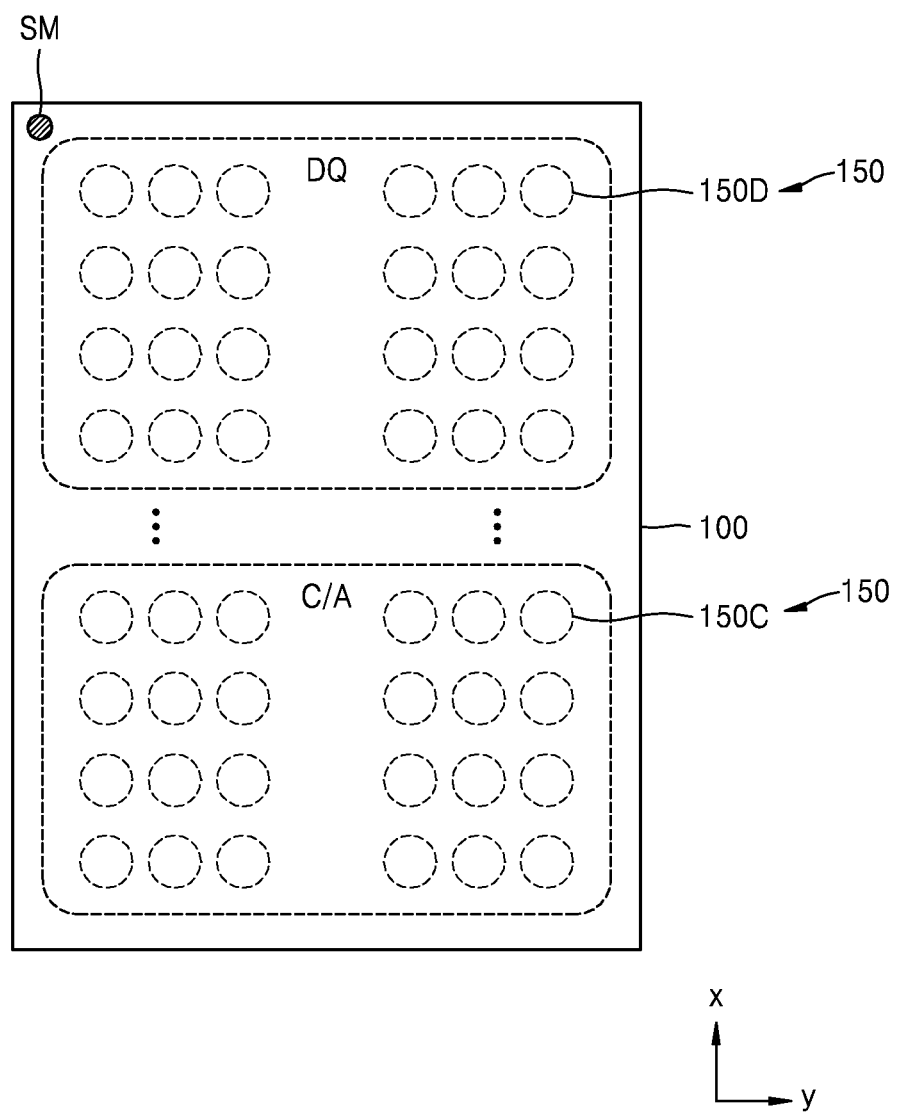
FIG. 4A is a top view of a package substrate in the semiconductor package of FIG. 1A.
Figure 4B:
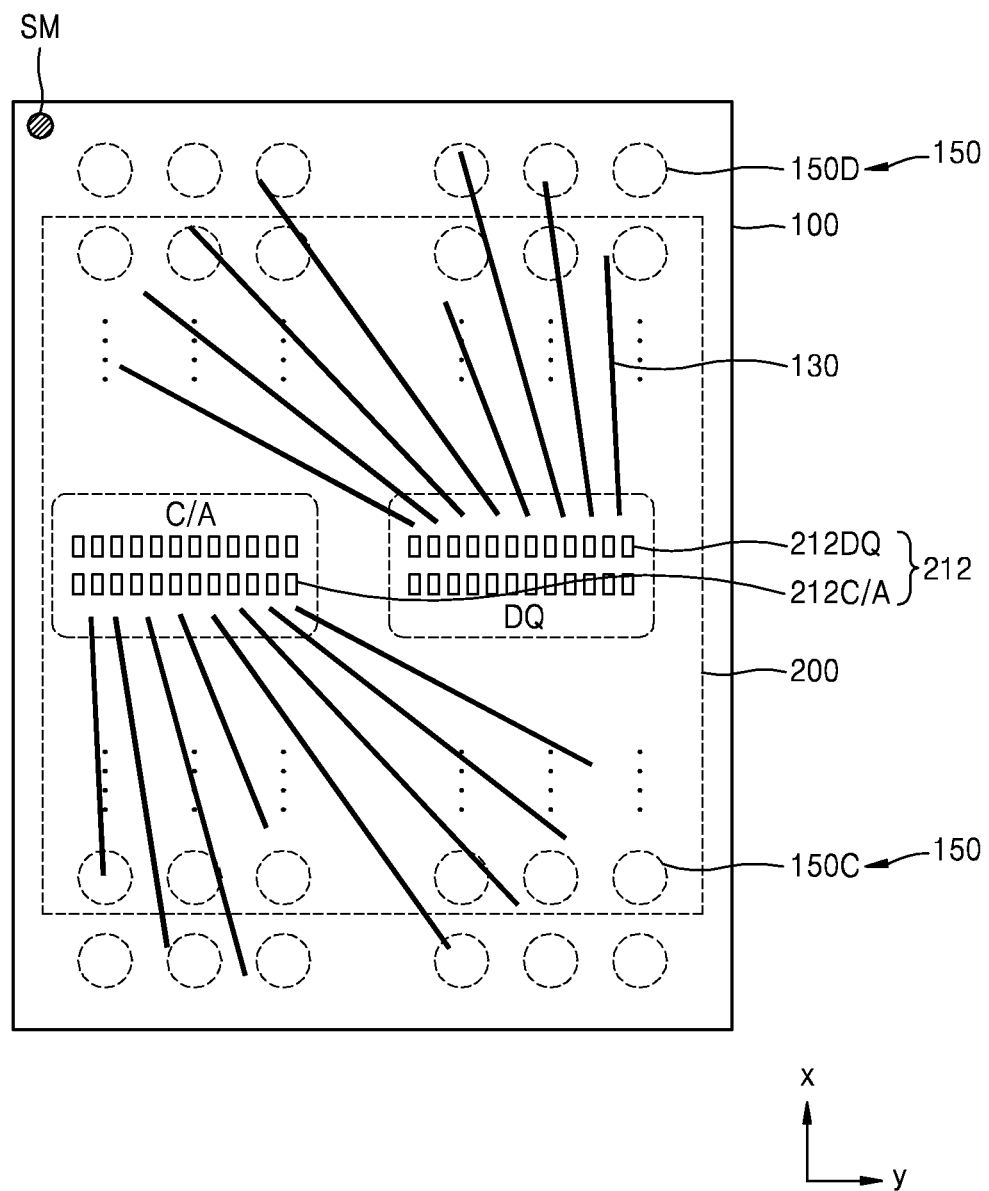
FIG. 4B is a conceptual diagram of a wiring connection relationship between a first semiconductor chip and a package substrate in the semiconductor package of FIG. 1A.

FIG. 4A is a top view of the package substrate 100 in the semiconductor package 1000 of FIG. 1A. FIG. 4B is a conceptual diagram of a wiring connection relationship between the first semiconductor chip 200 and the package substrate 100 in the semiconductor package 1000 of FIG. 1A.

Referring to FIGS. 4A and 4B, in the semiconductor package 1000 according to an exemplary embodiment, a plurality of the external connection terminals 150 may be disposed on a bottom surface of the package substrate 100 in a 2-dimensional (2D) array structure. Such external connection terminals 150 may be distinguishably disposed according to regions based on functions, as described above. For example, the DQ external connection terminal 150D may be disposed on an upper portion of the package substrate 100, and the C/A external connection terminal 150C may be disposed on a lower portion of the package substrate 100. In FIG. 4A, a region of the DQ external connection terminal 150D and a region of the C/A external connection terminal 150C are distinguished by dashed lines. The arrangement structure of the external connection terminal 150 may conform to a standardized arrangement structure.

For convenience of illustration, the external connection terminal 150 is shown by dashed lines in FIG. 4A, since the top view of FIG. 4A shows a top surface of the package substrate 100 and the external connection terminal 150 is not actually visible in this view. A reference mark SM is displayed at a corner portion of the top surface of the package substrate 100. A portion of the package substrate 100 close to the reference mark SM is defined as an upper portion, and a portion of the package substrate 100 far from the reference mark SM is defined as a lower portion.

The conceptual diagram of FIG. 4B may show a top surface of the package substrate 100 while the first semiconductor chip 200 is stacked thereon. The wiring 130 of the package substrate 100 is schematically illustrated. For example, a distance from the upper pad 212 or a connection member (for example, the connection member 230 of FIG. 1A) connected to the upper pad 212 to the external connection terminal 150 disposed on the bottom surface of the package substrate 100 is schematically displayed as the wiring 130. A DQ upper pad 212DQ may be connected to the DQ external connection terminal 150D disposed at the upper portion of the package substrate 100, and a C/A upper pad 212C/A may be connected to the C/A external connection terminal 150C disposed at the lower portion of the package substrate 100.

The upper pad 212 and the through electrode 210 are disposed in the center portion of the first semiconductor chip 200 in the second direction (y direction), and the connection member 230 is disposed accordingly. Thus, the length of the wiring 130 of the package substrate 100 connecting the connection member 230 to the external connection terminal 150 may be decreased, and a structure of the wiring 130 may be balanced.

In addition, in FIG. 4B, the upper pad 212 and the through electrode 210 are disposed in two columns in the center portion of the first semiconductor chip 200 in the second direction (y direction). For example, in FIG. 4B, a first group of upper pads 212 and through electrodes 210 is disposed in a first group (e.g., a C/A group) in the center portion of the first semiconductor chip 200 in the second direction (y direction), and a second group of upper pads 212 and through electrodes 210 is disposed in a second group (e.g., a DQ group) in the center portion of the first semiconductor chip 200 in the second direction (y direction), adjacent to the first group. However, the arrangement locations and the number of columns of the upper pad 212 and the through electrode 210 are not limited thereto. For example, the arrangement locations and the number of columns of the upper pad 212 and the through electrode 210 may be suitably determined such that the length of the wiring 130 from the connection member 230 to the external connection terminal 150 divided according to regions is the desired length.

Referring to a comparative example, when a first semiconductor chip does not include a through electrode, active surfaces of all of the first semiconductor chip and the second semiconductor chips 310, 320 and 330 may face upward. The first semiconductor chip may be mounted on a package substrate via wire bonding. Accordingly, in the package substrate, a structure of a wiring from a substrate pad connected to a wire to an external connection terminal is unbalanced, and a length of the wiring may be increased. When the length of the wiring of the package substrate is increased, a loading effect caused by parasitic capacitance generated in the package substrate may be increased, and a signal may be delayed. Accordingly, high speed operation of a semiconductor package and an electronic apparatus or electronic system including the semiconductor package may be hindered, and reliability may be decreased.

However, in the semiconductor package 1000 according to an exemplary embodiment, the first semiconductor chip 200 includes the through electrode 210 disposed in the center portion, and the upper pad 212, the inter-mediation pad 222, and the rewiring line 220 disposed on the backside, and is mounted on the package substrate 100 through the connection member 230. Accordingly, problems that may occur in a structure in which the first semiconductor chip is disposed on the package substrate 100 via wire bonding may be effectively solved or mitigated.

FIG. 5A is a cross-sectional view illustrating in detail a structure in which the inter-mediation pad 222 and the rewiring line 220 are connected to each other through the control region 250 in the first semiconductor chip 200 of FIG. 2C.

Referring to FIG. 5A, the inter-mediation pad 222 of the first semiconductor chip 200 may be connected to the circuit devices of the control region 250 through internal wiring 255 of the chip body layer 201. The rewiring line 220 of the first semiconductor chip 200 may be connected to the circuit devices of the control region 250 through the internal wiring 255. As a result, the inter-mediation pad 222 may be electrically connected to the rewiring line 220 through the control region 250.

The control region 250 may improve characteristics of signal transmission to and/or from the second semiconductor chips 310, 320 and 330 by performing, for example, re-shaping, re-timing, re-driving, etc. on a signal through the circuit devices included in the control region 250. The control region 250 may be referred to as a buffer region based on a performed function. By connecting the inter-mediation pad 222 to the rewiring line 220 through the control region 250, an interval between the inter-mediation pads 222 may be adjusted, and accordingly, generation of an electric short between the first through third wires 315, 325 and 335 connected to the inter-mediation pads 222 may be prevented.

Figure 5B:
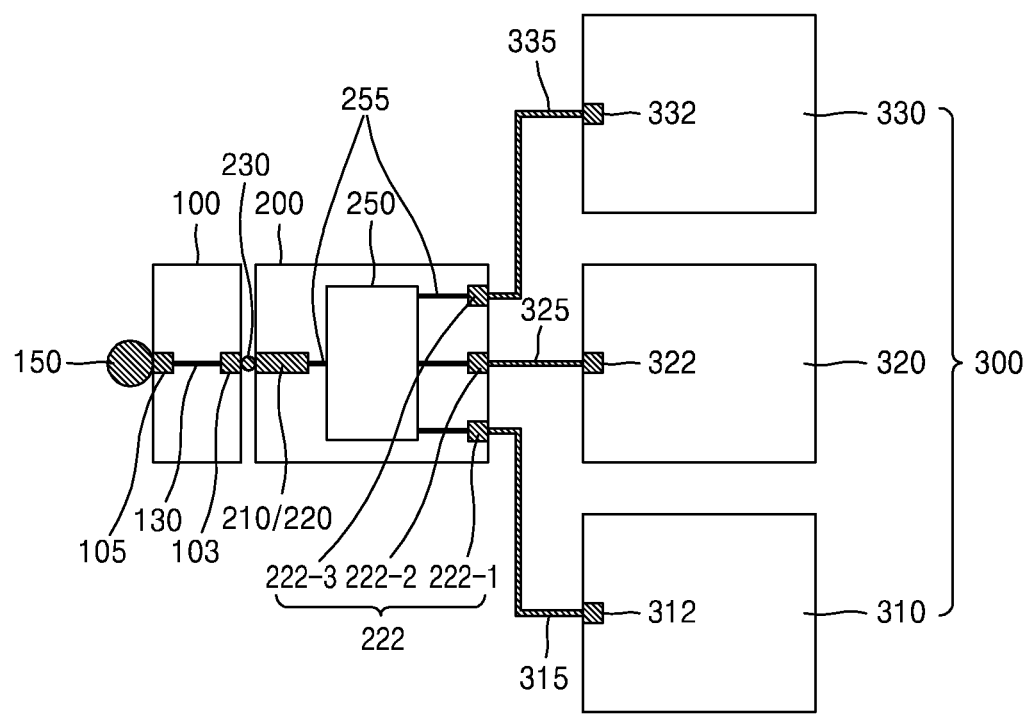
FIG. 5B is a conceptual diagram for describing processes of signal transmission in the semiconductor package of FIG. 1A.

FIG. 5B is a conceptual diagram for describing processes of signal transmission in the semiconductor package 1000 of FIG. 1A.

Referring to FIG. 5B, in the semiconductor package 1000 according to an exemplary embodiment, the first semiconductor chip 200 may be a master chip, and the second semiconductor chips 310, 320 and 330 may be slave chips. Herein, a master chip may refer to a chip that generates a clock signal, and a slave chip may refer to a chip that receives a clock signal generated by a master chip. For example, the first semiconductor chip 200 may read information of the second semiconductor chips 310, 320 and 330 or write information on the second semiconductor chips 310, 320 and 330 using a clock signal. The second semiconductor chips 310, 320 and 330 may respond to a request of the first semiconductor chip 200.

The package substrate 100 may transmit or receive a signal and/or power to or from an external electronic apparatus through the external connection terminal 150 on the lower substrate pad 105. The signal may include, for example, a data signal, a command signal, an address signal, etc. The package substrate 100 may transmit or receive a signal and/or power to or from the first semiconductor chip 200 through the upper substrate pad 103 and the connection member 230.

The first semiconductor chip 200 may include the through electrode 210, the rewiring line 220, the inter-mediation pad 222, the connection member 230, the control region 250, and the internal wiring 255. The circuit devices such as, for example, a transistor, may be disposed in the control region 250. The control region 250 may function as a buffer circuit and/or a control circuit. The internal wiring 255 may be electrically connected to the circuit devices of the control region 250. The control region 250 of the first semiconductor chip 200 may be connected to the package substrate 100 through the internal wiring 255, the rewiring line 220, the through electrode 210, and the connection member 230. The first semiconductor chip 200 may directly transmit or receive a signal to or from the package substrate 100 without passing through another semiconductor chip. Based on such characteristics of signal transmission of the first semiconductor chip 200, the first semiconductor chip 200 may be referred to as a master chip.

The second semiconductor chips 310, 320 and 330 may be electrically connected to the circuit devices of the control region 250 through the first through third wires 315, 325 and 335, the inter-mediation pad 222, and the internal wiring 255, and also connected to the package substrate 100 through the internal wiring 255, the rewiring line 220, the through electrode 210, and the connection member 230. As a result, the second semiconductor chips 310, 320 and 330 may transmit or receive a signal to or from the package substrate 100 through the control region 250 of the first semiconductor chip 200. Based on such characteristics of signal transmission of the second semiconductor chips 310, 320 and 330, the second semiconductor chips 310, 320 and 330 may be referred to as slave chips.

Figure 6:
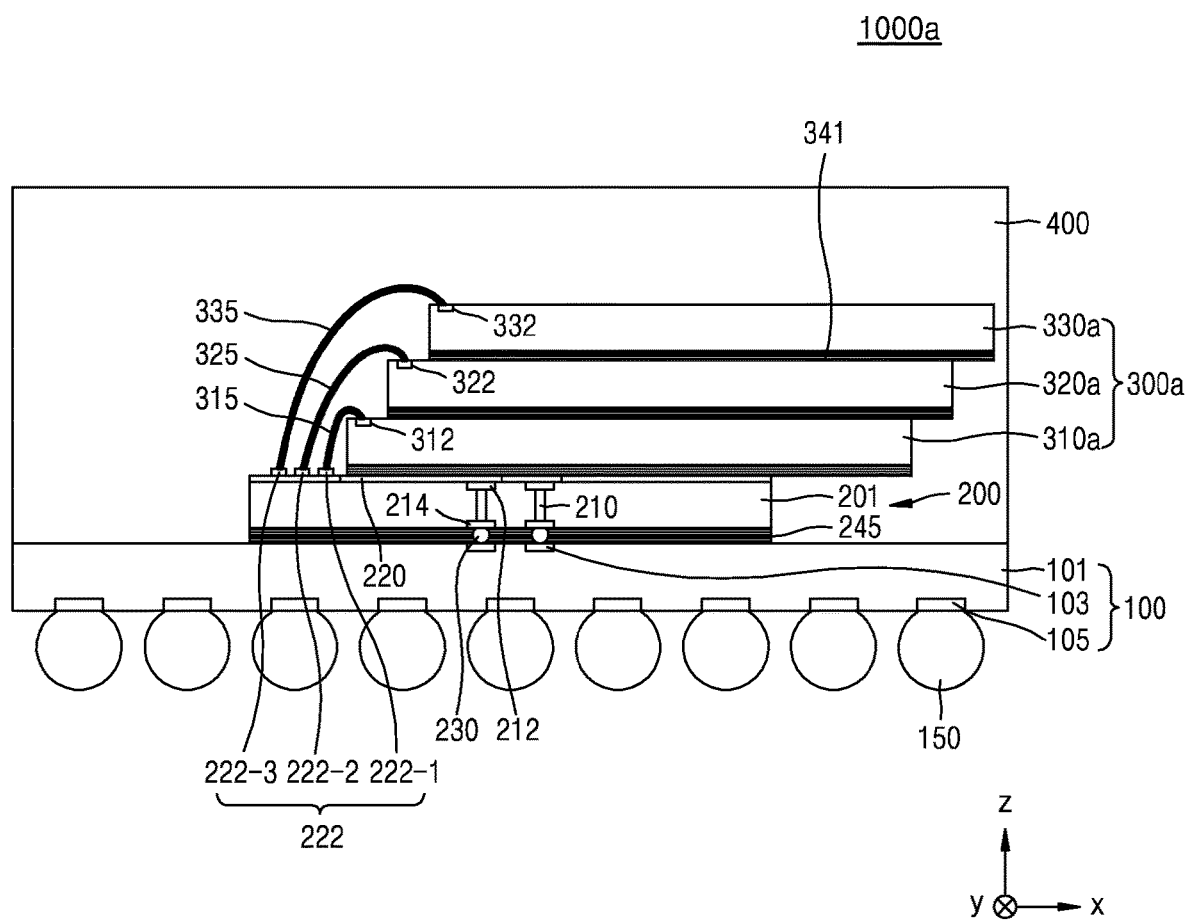
FIG. 6 is a cross-sectional view of a semiconductor package according to an exemplary embodiment of the present inventive concept.

FIG. 6 is a cross-sectional view of a semiconductor package 1000a according to an exemplary embodiment of the present inventive concept. Hereinafter, for convenience of explanation, a further description of details that have been previously described above with reference to FIGS. 1A through 5B may be omitted.

Referring to FIG. 6, the semiconductor package 1000a according to an exemplary embodiment may be different from the semiconductor package 1000 of FIG. 1A in that a stacked chip group 300a has a stepped stacked structure (compare to, for example, the stacked structure of the semiconductor package 1000 of FIG. 1B). For example, in the semiconductor package 1000a of the exemplary embodiment of FIG. 6, a bottom second semiconductor chip 310a of the stacked chip group 300a may be stacked on the first semiconductor chip 200 through the adhesive member 341 as in the semiconductor package 1000 of FIG. 1A, and may be electrically connected to the first inter-mediation pad 222-1 of the first semiconductor chip 200 through the first wire 315.

A middle second semiconductor chip 320a may be stacked on the bottom second semiconductor chip 310a through the adhesive member 341 and electrically connected to the second inter-mediation pad 222-2 of the first semiconductor chip 200 through the second wire 325. However, unlike the semiconductor package 1000 of FIG. 1A, the middle second semiconductor chip 320a is not aligned with the bottom second semiconductor chip 310a in a third direction (z direction), but rather, may be shifted and stacked in the first direction (x direction) such that the first chip pad 312 of the bottom second semiconductor chip 310a is exposed.

For example, in the exemplary embodiment of FIG. 1A (see also FIG. 1B), the middle second semiconductor chip 320 is stacked on and aligned with the bottom second semiconductor chip 310, thereby covering the first chip pad 312 of the bottom second semiconductor chip 310. In contrast, in the exemplary embodiment of FIG. 6, the first chip pad 312 of the bottom second semiconductor chip 310a is exposed, since the middle second semiconductor chip 320a is not aligned with the bottom second semiconductor chip 310a, and thus, does not cover the first chip pad 312.

A top second semiconductor chip 330a may be stacked on the middle second semiconductor chip 320a through the adhesive member 341 and electrically connected to the third inter-mediation pad 222-3 of the first semiconductor chip 200 through the third wire 335. Similar to the middle second semiconductor chip 320a, the top second semiconductor chip 330a may be shifted and stacked in the first direction (x direction) such that the second chip pad 322 of the middle second semiconductor chip 312a is exposed. That is, similar to the middle second semiconductor chip 320a, the top second semiconductor chip 330a may be stacked in a stepped manner.

For example, in the exemplary embodiment of FIG. 1A (see also FIG. 1B), the top second semiconductor chip 330 is stacked on and aligned with the middle second semiconductor chip 320, thereby covering the second chip pad 322 of the middle second semiconductor chip 310. In contrast, in the exemplary embodiment of FIG. 6, the second chip pad 322 of the middle second semiconductor chip 320a is exposed, since the top second semiconductor chip 330a is not aligned with the middle second semiconductor chip 320a, and thus, does not cover the second chip pad 322.

In the semiconductor package 1000a according to the exemplary embodiment of FIG. 6, since the stacked chip group 300a has a stepped stacked structure such that the first and second chip pads 312 and 322 of the bottom and middle second semiconductor chips 310a and 320a are exposed, a wire bonding process between the first and second wires 315 and 325 and the first and second chip pads 312 and 322, and a stacking process of the bottom, middle, and top second semiconductor chips 310a through 330a, may be facilitated. Accordingly, the semiconductor package 1000a according to the exemplary embodiment of FIG. 6 may realize a highly reliable semiconductor package with a low connection defect rate between the first and second wires 315 and 325 and the first and second chip pads 312 and 322.

Figure 7A:
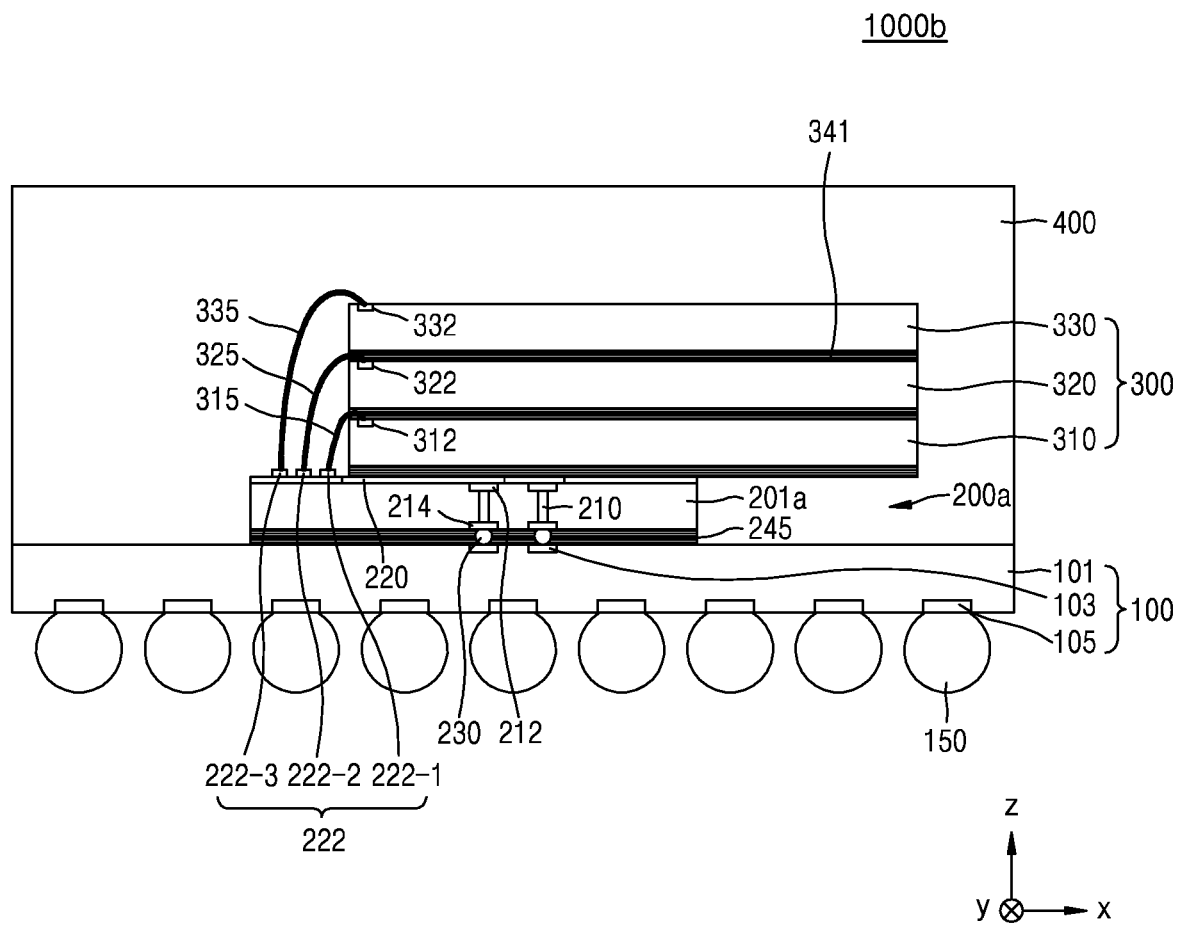
FIGS. 7A through 7C are cross-sectional views of semiconductor packages according to exemplary embodiments of the present inventive concept.
Figure 7B:
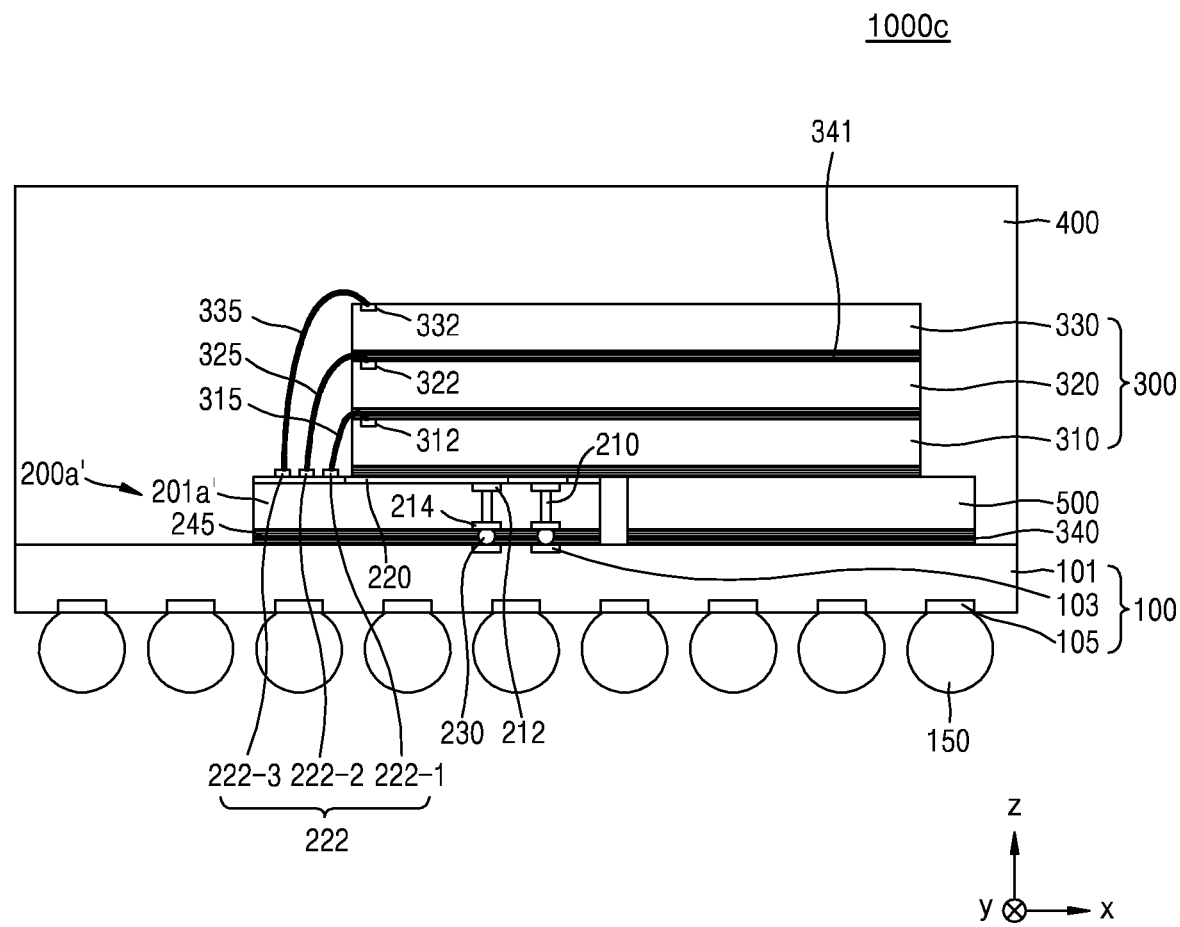
Figure 7C:
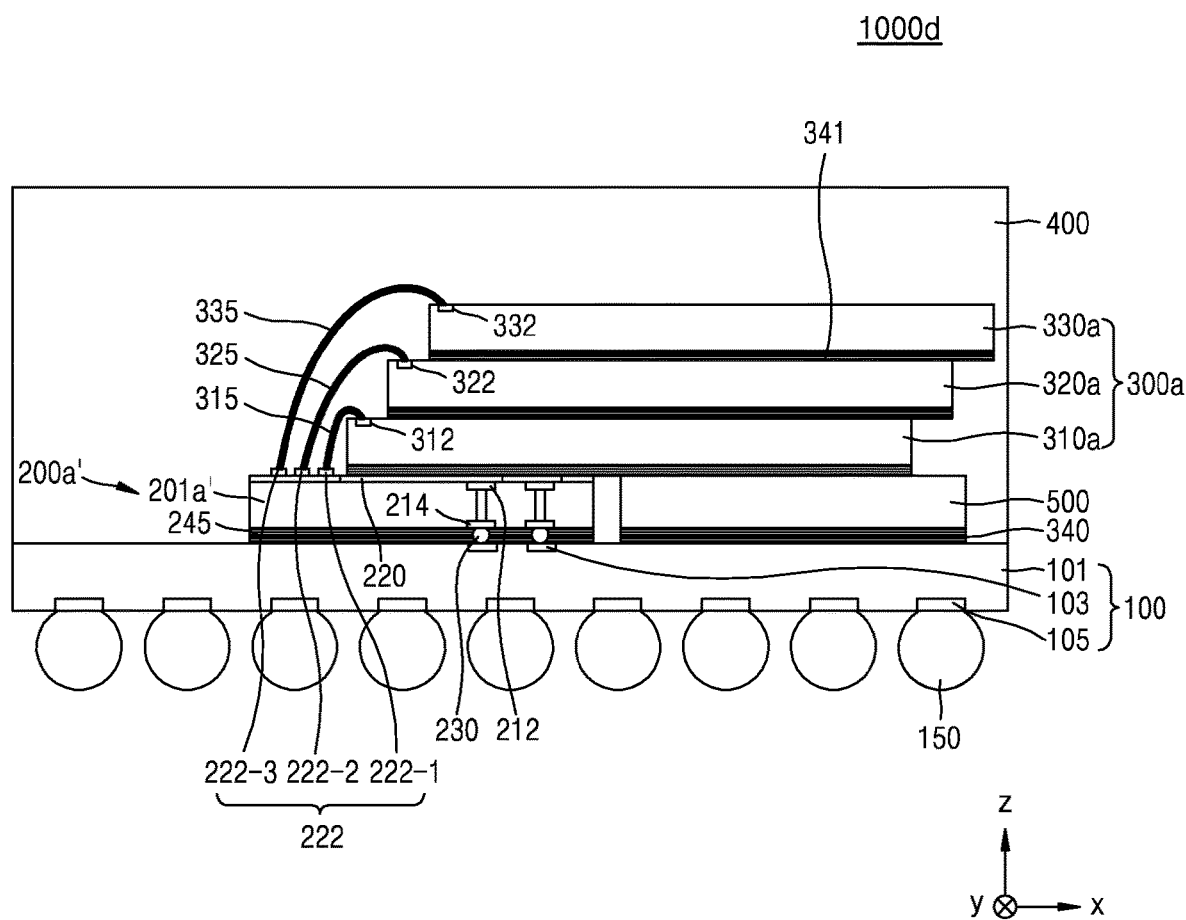
Figure 7D:
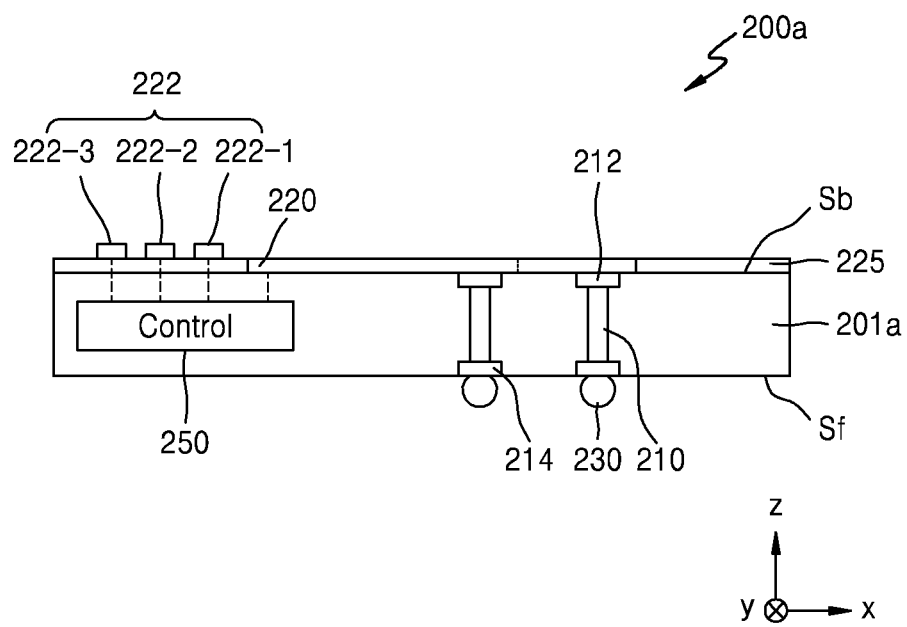
FIG. 7D is a cross-sectional view of a first semiconductor chip in the semiconductor package of FIG. 7A.

FIGS. 7A through 7C are cross-sectional views of semiconductor packages 1000b through 1000d according to exemplary embodiments of the present inventive concept. FIG. 7D is a cross-sectional view of a first semiconductor chip 200a in the semiconductor package 1000b of FIG. 7A, and corresponds to FIG. 2C (inasmuch as FIG. 2C is a cross-sectional view of a first semiconductor chip 200 of the exemplary embodiment of FIG. 1A). Hereinafter, for convenience of explanation, a further description of details that have been previously described above with reference to FIGS. 1A through 6 may be omitted.

Referring to FIGS. 7A and 7D, the semiconductor package 1000b according to an exemplary embodiment may be different from the semiconductor package 1000 of FIG. 1A with respect to a structure of the first semiconductor chip 200a. For example, in the semiconductor package 1000b according to the exemplary embodiment of FIG. 7A, the first semiconductor chip 200a may only include the control region 250 in a chip body layer 201a, and does not include a cell region in which memory devices are disposed. Accordingly, the first semiconductor chip 200a does not perform a memory function of storing data. For example, the first semiconductor chip 200a may only perform a buffering or control function of signal transmission to and/or from the second semiconductor chips 310, 320 and 330 through the control region 250.

Since the first semiconductor chip 200a includes only the control region 250, the size of the first semiconductor chip 200a may be smaller than that of the second semiconductor chips 310, 320 and 330. However, exemplary embodiments are not limited thereto. For example, according to an exemplary embodiment, even when the first semiconductor chip 200a includes only the control region 250, the size of the first semiconductor chip 200a may be substantially the same as that of the second semiconductor chips 310, 320 and 330.

When the first semiconductor chip 200a includes only the control region 250 and is smaller than the second semiconductor chips 310, 320 and 330, the through electrode 210 may be disposed slightly toward an edge portion of the first semiconductor chip 200a in the first direction (x direction) instead of a center portion of the first semiconductor chip 200a. For example, the through electrode 210 may be disposed closer to an edge portion of the first semiconductor chip 200a than to a center portion of the first semiconductor chip 200a. Similar to the first semiconductor chip 200 of the semiconductor package 1000 of FIG. 1A, the through electrode 210 may be disposed in two columns in the second direction (y direction). However, exemplary embodiments are not limited thereto. For example, in an exemplary embodiment, the number of columns of the through electrode 210 is not limited to two.

Referring to FIG. 7B, the semiconductor package 1000c according to an exemplary embodiment may be different from the semiconductor package 1000b of FIG. 7A in that a support chip 500 is further disposed on the package substrate 100. For example, in the semiconductor package 1000c according to an exemplary embodiment, the support chip 500 may be disposed on the package substrate 100 between the package substrate 100 and the stacked chip group 300.

The support chip 500 may support the stacked chip group 300 together with a first semiconductor chip 200a' by being stacked on the package substrate 100 through the adhesive member 341. Similar to the first semiconductor chip 200a of the semiconductor package 1000b of FIG. 7A, the first semiconductor chip 200a' may include only the control region 250. The first semiconductor chip 200a' of the semiconductor package 1000c of FIG. 7B may be smaller than the first semiconductor chip 200a of the semiconductor package 1000b of FIG. 7A.

Since the first semiconductor chip 200a' includes only the control region 250, an outer region of a location at which the through electrode 210 is disposed in the first direction (x direction) may not be needed (e.g., since additional space is not needed for a cell region). Accordingly, when a plurality of the same first semiconductor chips 200a' are manufactured in one wafer, the sizes of the first semiconductor chips 200a' may be reduced to manufacture more first semiconductor chips 200a'. However, since the size of the first semiconductor chip 200a' is small and a space for the inter-mediation pad 222 needs to be secured, a support function of the stacked chip group 300 by the first semiconductor chip 200a' may be weakened. Accordingly, the support chip 500 may be disposed between the stacked chip group 300 and the package substrate 100 so as to strengthen the support function of the stacked chip group 300.

For example, in exemplary embodiments, when the size of the first semiconductor chip 200a' is decreased such that the first semiconductor chip 200a' may not provide adequate support for the stacked chip group 300 stacked thereon, the support chip 500 may be further disposed to provide additional support.

Since the support chip 500 performs only the support function with respect to the stacked chip group 300, the support chip 500 may be formed of a relatively inexpensive material, such as, for example, glass or resin. The support chip 500 may be formed of a material capable of buffering a difference of a coefficient of thermal expansion between the package substrate 100 and the stacked chip group 300.

Referring to FIG. 7C, the semiconductor package 1000d according to an exemplary embodiment may have a combined structure of the semiconductor packages 1000a and 1000c of FIGS. 6 and 7B. For example, the semiconductor package 1000d according to an exemplary embodiment may further include the support chip 500 disposed on the package substrate 100 between the package substrate 100 and the stacked chip group 300a, and may have a stepped stacked structure of the stacked chip group 300a.

For example, in the semiconductor package 1000d according to an exemplary embodiment, the first semiconductor chip 200a' may include only the control region 250, and may be smaller than the bottom, middle, and top second semiconductor chips 310a, 320a and 330a. Accordingly, to support a support function with respect to the stacked chip group 300a of the first semiconductor chip 200a', the support chip 500 may be disposed on the package substrate 100. Further, the bottom, middle, and top second semiconductor chips 310a, 320a and 330a in the stacked chip group 300a may be stacked in a stepped structure such that the first and second chip pads 312 and 322 are exposed. Accordingly, connection defects between the first and second wires 315 and 325 and the first and second chip pads 312 and 322 may be decreased, and thus, reliability of the semiconductor package 1000d may be increased.

Figure 8A:
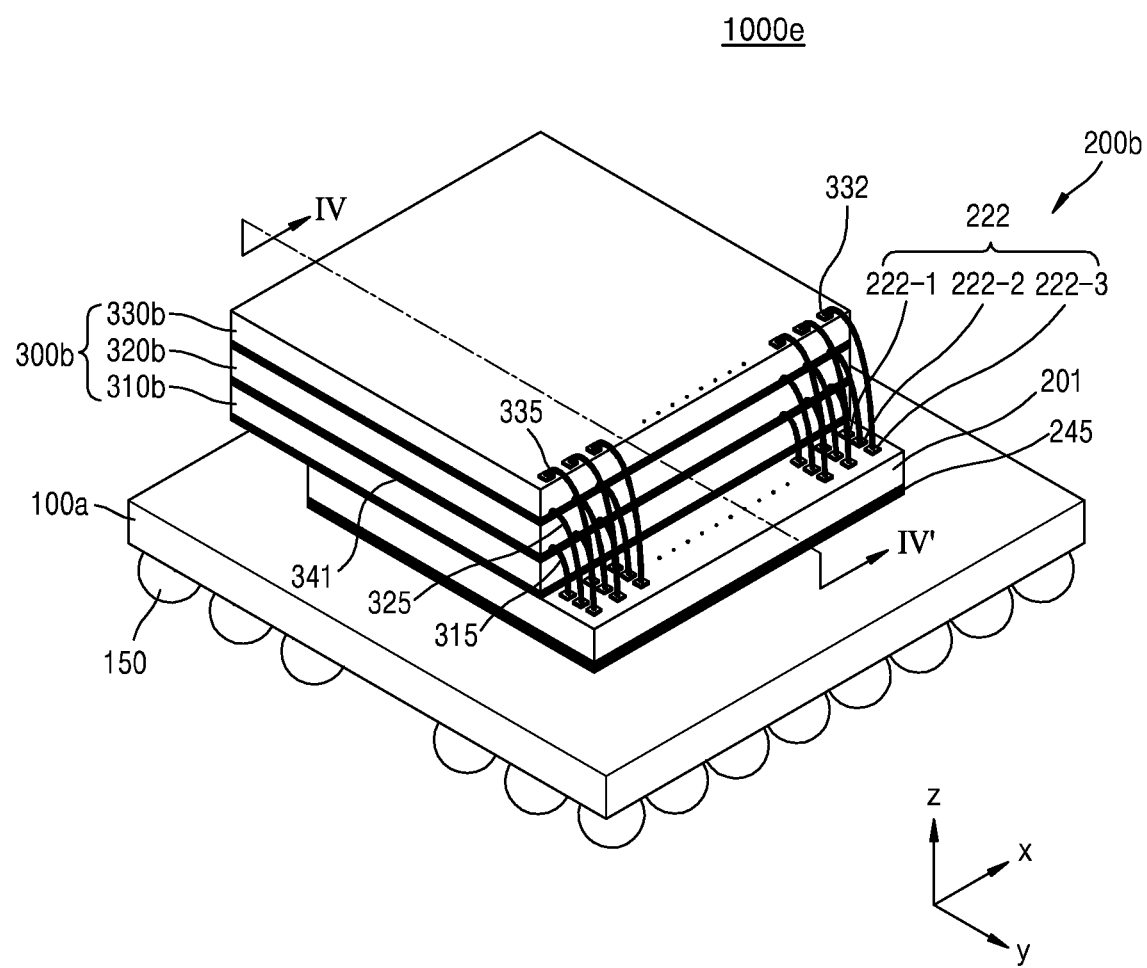
FIG. 8A is a perspective view of a semiconductor package according to an embodiment.
Figure 8B:
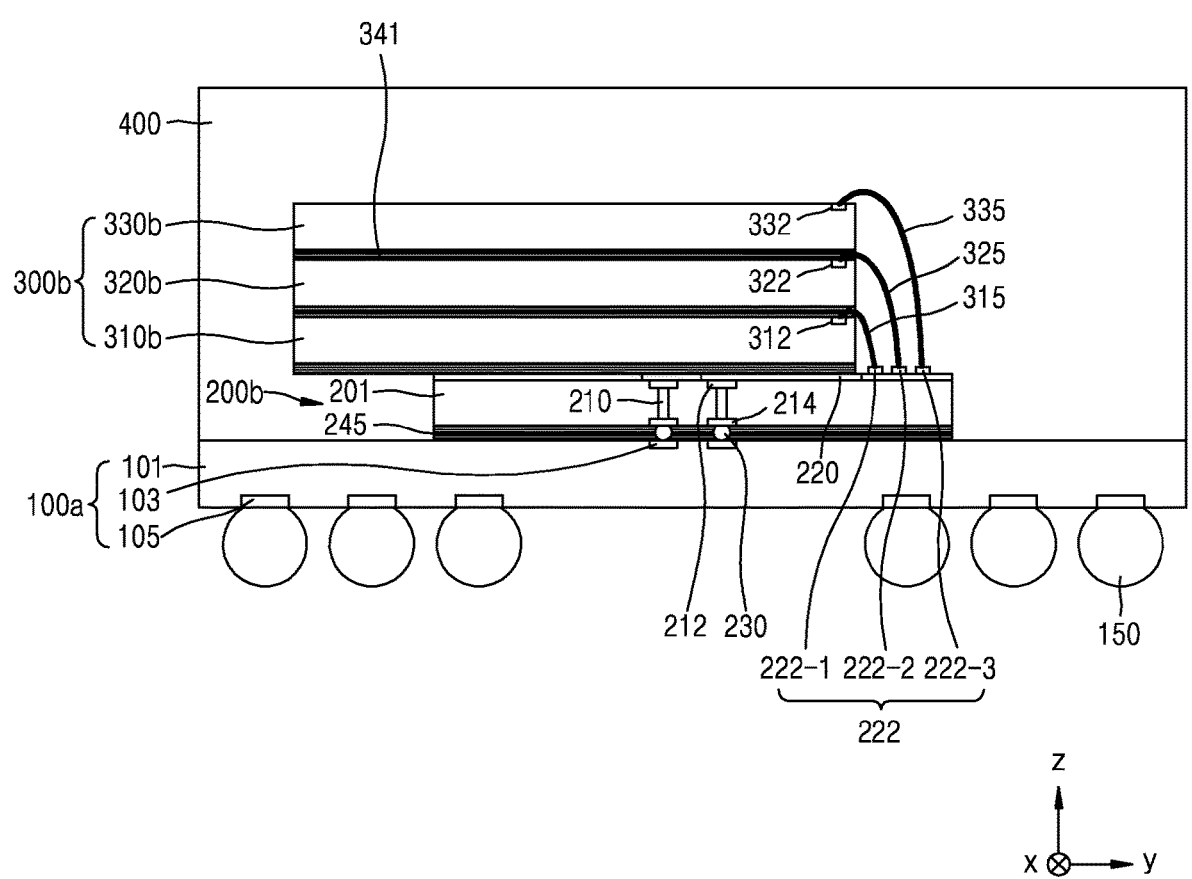
FIG. 8B is a cross-sectional view taken along a line IV-IV' of FIG. 8A.
Figure 9A:
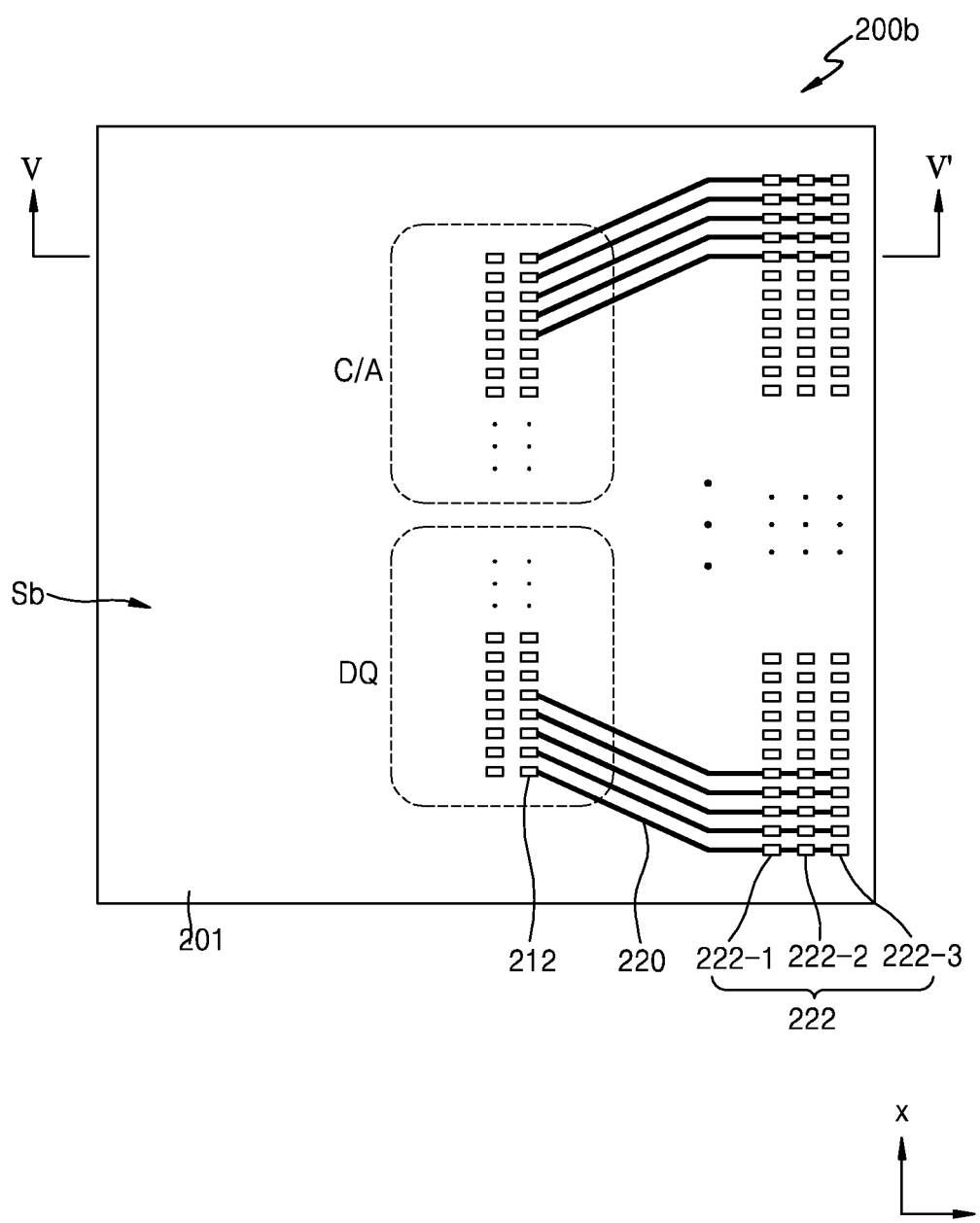
FIG. 9A is a top view of a first semiconductor chip in the semiconductor package of FIG. 8A.
Figure 9B:
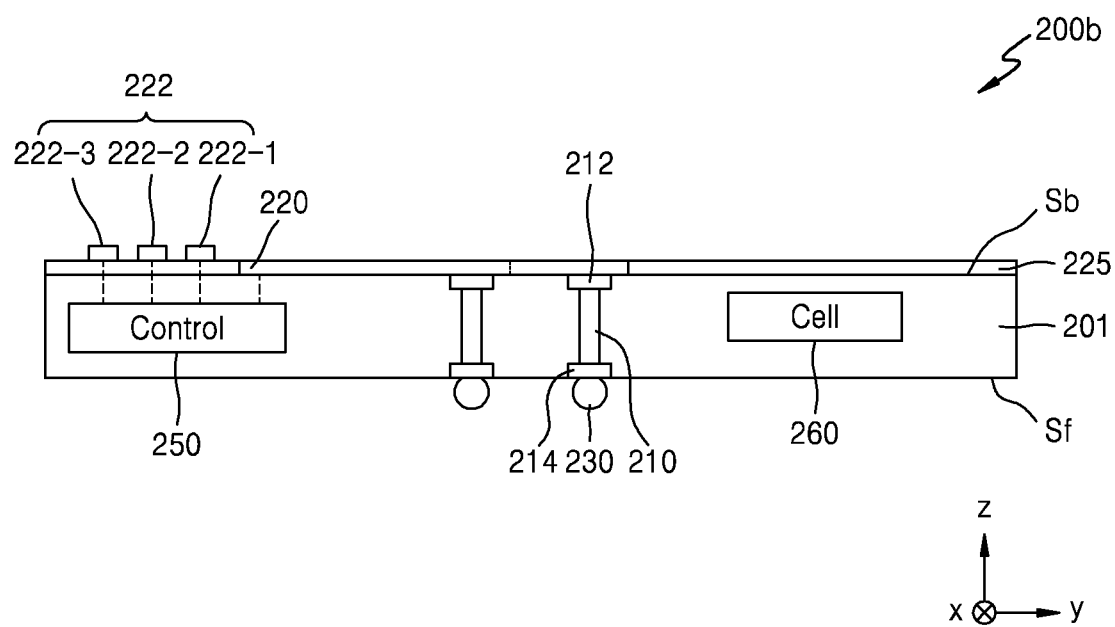
FIG. 9B is a cross-sectional view taken along line V-V' of FIG. 9A.
Figure 9C:
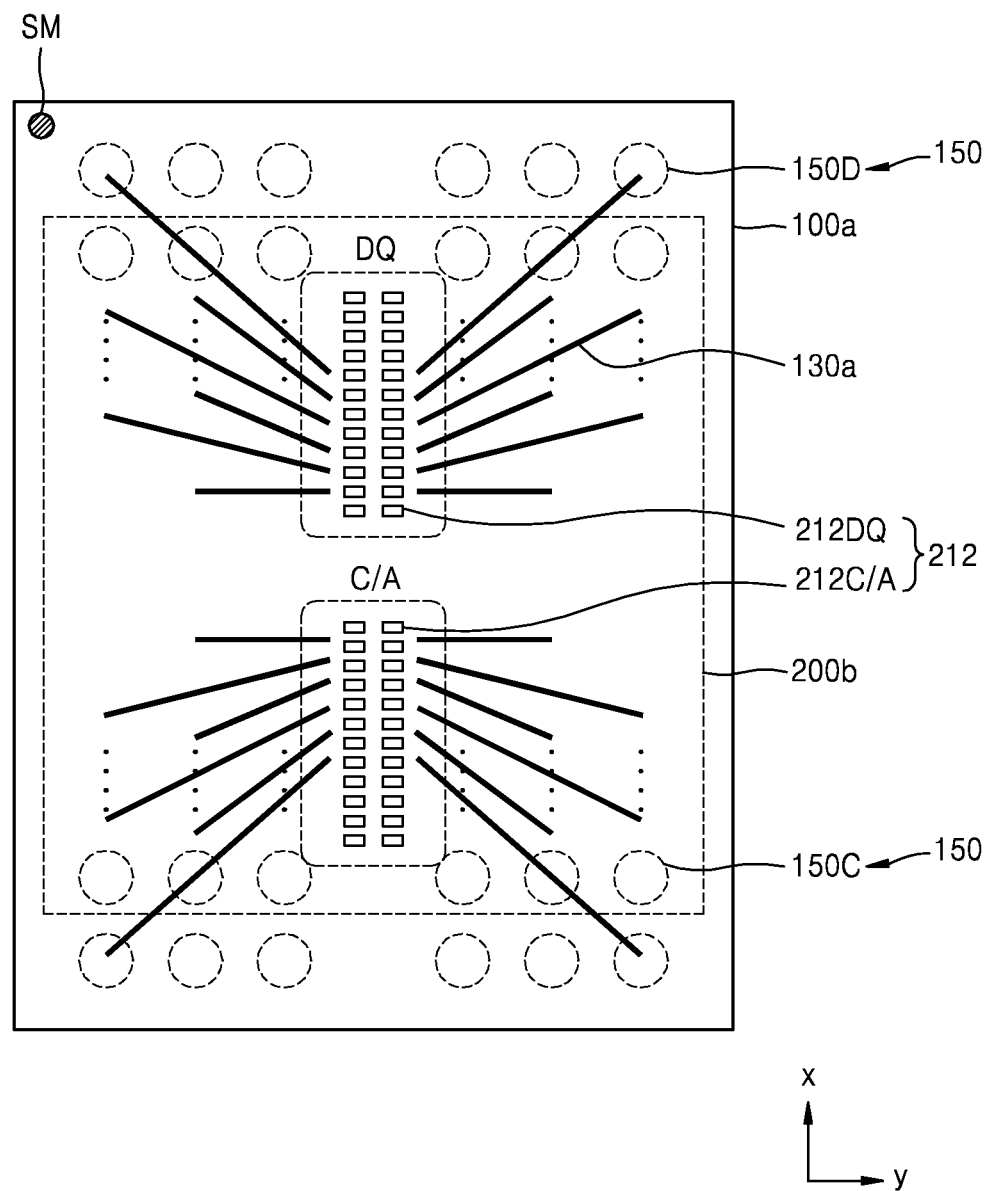
FIG. 9C is a conceptual diagram of a wiring connection relationship between a first semiconductor chip and a package substrate in the semiconductor package of FIG. 8A.

FIG. 8A is a perspective view of a semiconductor package 1000e according to an exemplary embodiment of the present inventive concept. FIG. 8B is a cross-sectional view taken along line IV-IV' of FIG. 8A. FIG. 9A is a top view of a first semiconductor chip 200b in the semiconductor package 1000e of FIG. 8A. FIG. 9B is a cross-sectional view taken along line V-V' of FIG. 9A. FIG. 9C is a conceptual diagram of a wiring connection relationship between the first semiconductor chip 200b and a package substrate 100a in the semiconductor package 1000e of FIG. 8A. For convenience of explanation, a further description of details that have been previously described above with reference to FIGS. 1A through 7D may be omitted.

Referring to FIGS. 8A through 9C, the semiconductor package 1000e according to an exemplary embodiment may be different from the semiconductor package 1000 of FIG. 1A with respect to an arrangement structure of the first semiconductor chip 200b and a stacked chip group 300b. Further, the semiconductor package 1000e according to an exemplary embodiment may be different from the semiconductor package 1000 of FIG. 1A with respect to a structure of wiring 130a of the package substrate 100a.

For example, similar to the first semiconductor chip 200 of the semiconductor package 1000 of FIG. 1A, in the semiconductor package 1000e according to an exemplary embodiment, the first semiconductor chip 200b may include the chip body layer 201, the through electrode 210, the rewiring line 220, and the connection member 230. The first semiconductor chip 200 may include the control region 250 and the cell region 260 in the chip body layer 201. According to an exemplary embodiment, the first semiconductor chip 200b may include only the control region 250 in the chip body layer 201 (e.g., in an exemplary embodiment, the first semiconductor chip 200b does not include the cell region 260). The inter-mediation pad 222 and the upper pad 212 may be disposed on the back-side Sb of the first semiconductor chip 200b and connected to each other through the rewiring line 220.

Unlike the first semiconductor chip 200 of the semiconductor package 1000 of FIG. 1A, in the first semiconductor chip 200b, the through electrode 210 and the upper pad 212 may be disposed in two columns in the first direction (x direction). Also, unlike the first semiconductor chip 200 of the semiconductor package 1000 of FIG. 1A, the inter-mediation pad 222 may be disposed in three columns in the first direction (x direction). For example, in the first semiconductor chip 200 of the semiconductor package 1000 of FIG. 1A, directions in which the through electrode 210 and upper pad 212 are disposed and a direction in which the inter-mediation pad 222 is disposed may be the second direction (y direction). Alternatively, in the first semiconductor chip 200b of the semiconductor package 1000e according to the exemplary embodiment of FIGS. 8A through 9C, a direction in which the through electrode 210 and the upper pad 212 are disposed and a direction in which the inter-mediation pad 222 is disposed may be the first direction (x direction). Since the direction in which the upper pad 212 is disposed and the direction in which the inter-mediation pad 222 is disposed are the first direction (x direction), the rewiring line 220 may connect the upper pad 212 and the inter-mediation pad 222 in the second direction (y direction).

Second semiconductor chips 310b, 320b and 330b of the stacked chip group 300b, which are stacked on the first semiconductor chip 200b, may be electrically connected to the first semiconductor chip 200b via wire bonding. Since the inter-mediation pad 222 of the first semiconductor chip 200b is disposed in the first direction (x direction), the first through third chip pads 312, 322 and 332 of the second semiconductor chips 310b, 320b and 330b may also be disposed in the first direction (x direction). According to an exemplary embodiment, the second semiconductor chips 310b, 320b and 330b of the stacked chip group 300b may have a stepped stacked structure as in the semiconductor package 1000a of FIG. 6.

As a result, a structure of the semiconductor package 1000e according to the exemplary embodiment of FIGS. 8A through 9C may correspond to a structure in which the first semiconductor chip 200 and the stacked chip group 300 of the semiconductor package 1000 of FIG. 1A are rotated about 90° on the package substrate 100. For example, the first semiconductor chip 200b and the second semiconductor chips 310b, 320b and 330b of the stacked chip group 300b of the semiconductor package 1000e of FIGS. 8A through 9C may be respectively identical to the first semiconductor chip 200 and the second semiconductor chips 310, 320 and 330 of the stacked chip group 300 of the semiconductor package 1000 of FIG. 1A. The first semiconductor chip 200b and the second semiconductor chips 310b, 320b and 330b of the stacked chip group 300b may be stacked on the package substrate 100a in a structure rotated about 90° compared to the semiconductor package 1000 of FIG. 1A.

In the semiconductor package 1000e, since the through electrode 210 and the upper pad 212 of the first semiconductor chip 200b are disposed in the center portion in the first direction (x direction), the lower pad 214 and the connection member 230 may also be disposed in the center portion in the first direction (x direction). Accordingly, a structure of the wiring 130a from the connection member 230 to the external connection terminal 150 disposed on a bottom surface of the package substrate 100a may be as shown in FIG. 9C.

For example, similar to the package substrate 100 of the semiconductor package 1000 of FIG. 1A, in the external connection terminal 150 of the package substrate 100a, the DQ external connection terminal 150D may be disposed in the upper portion, and the C/A external connection terminal 150C may be disposed in the lower portion. The upper pad 212 of the first semiconductor chip 200b and the corresponding connection member 230 may be disposed in the center portion of the first semiconductor chip 200b in the first direction (x direction). As displayed by a rectangle in a dashed line in FIG. 9C, a plurality of DQ upper pads 212DQ and a plurality of C/A upper pads 212C/A may be separately disposed in the first direction (x direction). Based on such an arrangement structure of the upper pad 212 and the corresponding connection member 230, the wiring 130a of the package substrate 100a may extend in two directions of the second direction (y direction) in the center portion corresponding to the upper pad 212.

The DQ upper pad 212DQ is disposed in the upper portion of the first semiconductor chip 200b correspondingly to the upper portion at a location at which the DQ external connection terminal 150D is disposed, and the C/A upper pad 212C/A is disposed in the lower portion of the first semiconductor chip 200b correspondingly to the lower portion at a location at which the C/A external connection terminal 150C is disposed. Thus, the length of the wiring 130a may be decreased, and a structure of the wiring 130a may be balanced. Accordingly, a signal delay phenomenon and a loading phenomenon by capacitance of the semiconductor package 1000e according to an exemplary embodiment may be improved, and as a result, an electronic apparatus or an electronic system that operates at a high speed while having an improved SI characteristic may be realized.

Figure 10:
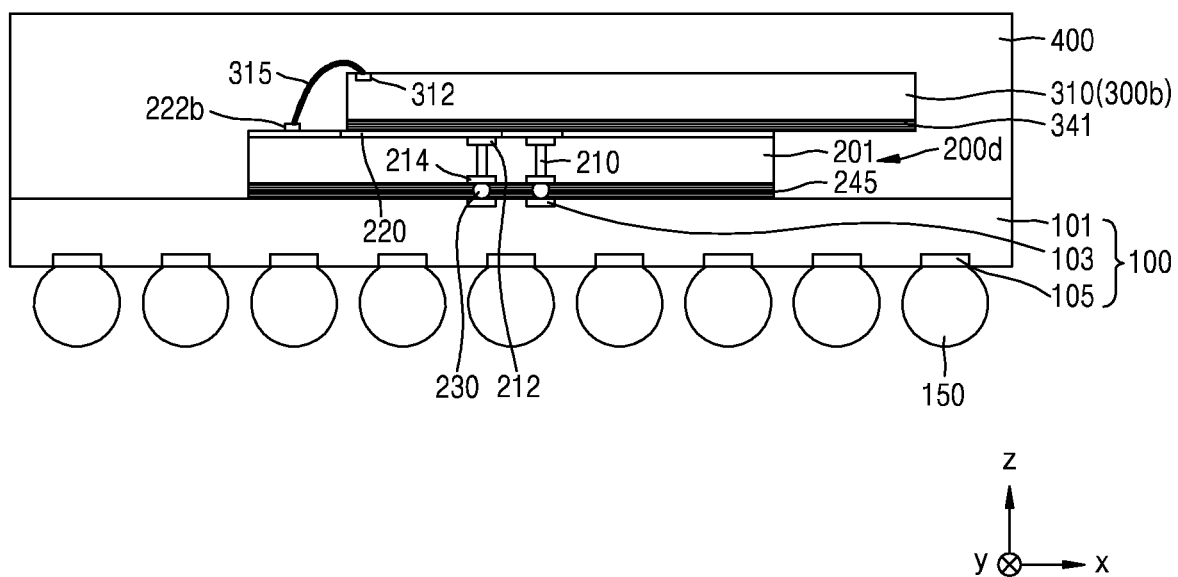
Figure 11:
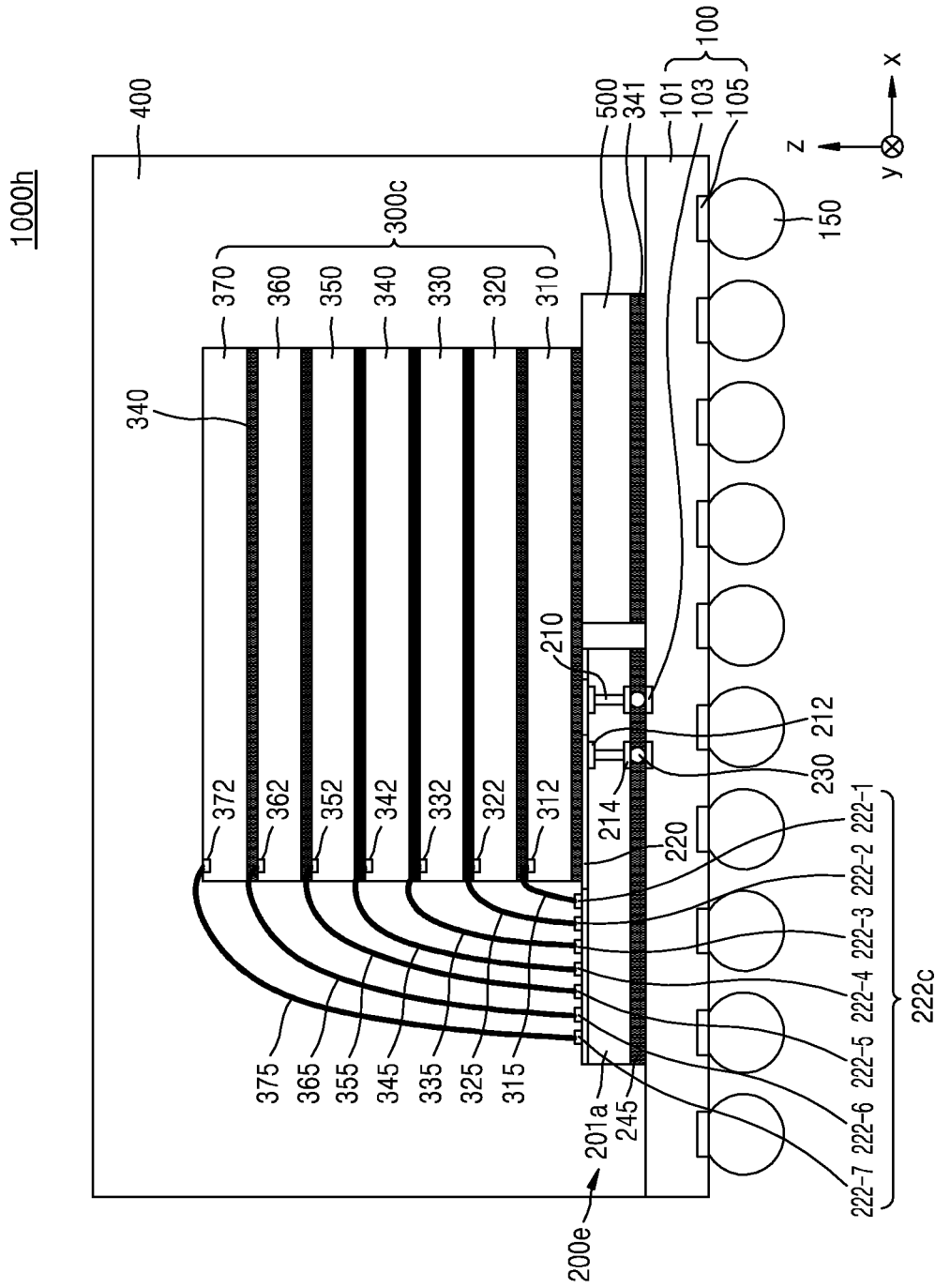

FIGS. 10 through 12 are cross-sectional views of semiconductor packages 1000g through 1000i according to exemplary embodiments of the present inventive concept. For convenience of explanation, a further description of details that have been previously described above with reference to FIGS. 1A through 9C may be omitted.

Referring to FIG. 10, the semiconductor package 1000g according to an exemplary embodiment may be different from the semiconductor package 1000 of FIG. 1A in that the stacked chip group 300b includes only one second semiconductor chip 310. For example, in the semiconductor package 1000g of the exemplary embodiment of FIG. 10, the stacked chip group 300b may be stacked on a first semiconductor chip 200d, and the stacked chip group 300b includes only one second semiconductor chip 310. When the stacked chip group 300b includes only one second semiconductor chip 310, only one column of an inter-mediation pad 222b may be disposed on a back-side of the first semiconductor chip 200d, and connected to the first chip pad 312 of the one second semiconductor chip 310. The first chip pad 312 of the second semiconductor chip 310 and the inter-mediation pad 222b may be connected to each other through the first wire 315.

The through electrode 210, the upper pad 212, the lower pad 214, and the connection member 230 may be disposed in two columns in the second direction (y direction). However, exemplary embodiments are not limited thereto. For example, in an exemplary embodiment, since the inter-mediation pad 222b is disposed in only one column, the through electrode 210, the upper pad 212, the lower pad 214, and the connection member 230 may be disposed in one column in the second direction (y direction), according to an exemplary embodiment.

Referring to FIG. 11, the semiconductor package 1000h according to an exemplary embodiment may be different from the semiconductor package 1000 of FIG. 1A in that a stacked chip group 300c includes seven second semiconductor chips 310, 320, 330, 340, 350, 360 and 370, and further includes the support chip 500. For example, in the semiconductor package 1000h according to the exemplary embodiment of FIG. 11, the stacked chip group 300c may be stacked on a first semiconductor chip 200e and the support chip 500, and the stacked chip group 300c includes the seven second semiconductor chips 310, 320, 330, 340, 350, 360 and 370. When the stacked chip group 300c includes the seven second semiconductor chips 310, 320, 330, 340, 350, 360 and 370, seven columns (e.g., 222-1, 222-2, 222-3, 222-4, 222-5, 222-6 and 222-7) of inter-mediation pad 222c may be disposed on a back-side of the first semiconductor chip 200e correspondingly to chip pads 312, 322, 332, 342, 352, 362 and 372 of the seven second semiconductor chips 310, 320, 330, 340, 350, 360 and 370. The chip pads 312, 322, 332, 342, 352, 362 and 372 of the second semiconductor chips 310, 320, 330, 340, 350, 360 and 370 may be connected to the inter-mediation pad 222c respectively through first through seventh wires 315, 325, 335, 345, 355, 365 and 375.

Similar to the first semiconductor chip 200a of FIG. 7D, in the semiconductor package 1000h, the first semiconductor chip 200e may include only the control region 250, since capacity may be sufficient as the stacked chip group 300c includes the seven second semiconductor chips 310, 320, 330, 340, 350, 360 and 370. However, the first semiconductor chip 200e is not completely excluded from including a cell region. For example, in an exemplary embodiment according to FIG. 11, the first semiconductor chip 200e may or may not include a cell region. When the inter-mediation pad 222c is disposed in seven columns, an exposed area of the back-side of the first semiconductor chip 200e is increased, and thus, a support function of the stacked chip group 300c may be weakened. Accordingly, the support chip 500 may be disposed between the stacked chip group 300c and the package substrate 100. According to an exemplary embodiment, the support chip 500 may be omitted when the first semiconductor chip 200e is large and has a sufficient support function for the stacked chip group 300c.

The through electrode 210, the upper pad 212, the lower pad 214, and the connection member 230 may be disposed in two columns in the second direction. However, exemplary embodiments are not limited thereto. For example, in an exemplary embodiment, since the inter-mediation pad 222b is disposed in seven columns, the through electrode 210, the upper pad 212, the lower pad 214, and the connection member 230 may be disposed in at least three columns in the second direction (y direction).

Referring to FIG. 12, the semiconductor package 1000i according to an exemplary embodiment may be different from the semiconductor package 1000h of FIG. 11 with reference to a structure of a stacked chip group 300d. For example, in the semiconductor package 1000i of the exemplary embodiment of FIG. 12, the stacked chip group 300d may include seven second semiconductor chips 310, 320, 330, 340, 350, 360 and 370. Included among the seven second semiconductor chips 310, 320, 330, 340, 350, 360 and 370 are four upper second semiconductor chips 340, 350, 360 and 370 which are shifted and stacked on the top second semiconductor chip 330 in the first direction.

As shown in FIG. 12, in an exemplary embodiment, lower second semiconductor chips 310, 320 and 330 are stacked on one another and aligned with one another, upper second semiconductor chips 340, 350, 360 and 370 are stacked on one another and aligned with one another, and the upper second semiconductor chips 340, 350, 360 and 370 are stacked on top of and not aligned with the lower second semiconductor chips 310, 320 and 330.

The third chip pad 332 and intermediate chip pads 336, 337, 338 and 339 may be disposed on a top surface of the top second semiconductor chip 330 (e.g., the top second semiconductor chip from among the three lower second semiconductor chips 310, 320 and 33). The chip pads 342, 352, 362 and 372 of the upper four second semiconductor chips 340, 350, 360 and 370 may be connected to the intermediate chip pads 336, 337, 338 and 339 through the fourth through seventh wires 345, 355, 365 and 375. Accordingly, the upper four second semiconductor chips 340, 350, 360 and 370 may be connected to the third inter-mediation pad 222-3 of the first semiconductor chip 200a through the third wire 335 and the top second semiconductor chip 330, and connected to the package substrate 100 through the rewiring line 220, the through electrode 210, and the connection member 230.

Similar to the first semiconductor chip 200a of FIG. 7D, in the semiconductor package 1000i according to the exemplary embodiment of FIG. 12, the first semiconductor chip 200a may include only the control region 250. However, exemplary embodiments are not limited thereto. For example, according to an embodiment, the first semiconductor chip 200a included in the semiconductor package 1000i may include a cell region. In an exemplary embodiment, when the size of the first semiconductor chip 200a is decreased and an exposed area of the back-side is increased, the support chip 500 may be disposed between the stacked chip group 300d and the package substrate 100 to provide additional support. However, according to an exemplary embodiment, the support chip 500 may be omitted from the semiconductor package 1000i.

Although a stacked chip group includes one, three, or seven second semiconductor chips in the above-described exemplary embodiments, it is to be understood that the number of second semiconductor chips included in the stacked chip group is not limited thereto.

While the present inventive concept has been particularly shown and described with reference to the exemplary embodiments thereof, it will be understood that various changes in form and detail may be made therein without departing from the spirit and scope of the present inventive concept as defined by the following claims.

What is claimed is:

1. A semiconductor chip, comprising:
a semiconductor substrate comprising a first surface that is an active surface and a second surface that is opposite to the first surface;
a through electrode penetrating the semiconductor substrate and disposed in at least one column in a first direction in a center portion of the semiconductor substrate;
an inter-mediation pad disposed in at least one column in the first direction in an edge portion of the second surface;
an upper pad disposed on the second surface and connected to the through electrode; and
a rewiring line disposed on the second surface and connecting the inter-mediation pad to the upper pad.

2. The semiconductor chip of claim 1,
wherein a number of the at least one column of the inter-mediation pad is equal to a number of additional semiconductor chips disposed on the semiconductor substrate,
wherein a region in which the inter-mediation pad is disposed is divided into a first region and a second region in the first direction,
a region in which the upper pad is disposed is divided into a third region corresponding to the first region and a fourth region corresponding to the second region in the first direction,
wherein the inter-mediation pad in the first region is connected to the upper pad in the third region through the rewiring line, and the inter-mediation pad in the second region is connected to the upper pad in the fourth region through the rewiring line,
wherein the inter-mediation pad disposed in the first region is configured to communicate a data signal, and the inter-mediation pad disposed in the second region is configured to communicate a command and address signal.

3. The semiconductor chip of claim 1, further comprising:
at least one of a control region or a cell region disposed on the semiconductor substrate.

4. The semiconductor chip of claim 1, further comprising:
a wiring layer disposed on the first surface; and
a connection member disposed on a bottom surface of the wiring layer,
wherein the through electrode is connected to the connection member through the wiring layer.

5. A semiconductor package, comprising:
a package substrate;
an external connection terminal disposed on a bottom surface of the package substrate;
a first semiconductor chip disposed on the package substrate, wherein the first semiconductor chip comprises a first surface that is an active surface and a second surface opposite to the first surface, wherein the first semiconductor chip comprises:
a through electrode disposed in a center portion of the first semiconductor chip; and
an inter-mediation pad disposed in an edge portion of the second surface of the first semiconductor chip;
at least one second semiconductor chip disposed on the first semiconductor chip,
wherein the at least one second semiconductor chip comprises an active surface that faces a same direction as the second surface of the first semiconductor chip, and a chip pad disposed on the active surface of the at least one second semiconductor chip,
wherein the inter-mediation pad is exposed; and
a rewiring line disposed on the second surface of the first semiconductor chip,
wherein the chip pad is connected to the inter-mediation pad through a wire, the inter-mediation pad is connected to the through electrode through the rewiring line, and the through electrode is connected to the external connection terminal.

6. The semiconductor package of claim 5, wherein the first semiconductor chip further comprises:
an upper pad disposed on the second surface in the center portion of the first semiconductor chip and connected to the through electrode,
wherein the rewiring line connects the inter-mediation pad to the upper pad.

7. The semiconductor package of claim 6,
wherein the inter-mediation pad is one of a plurality of inter-mediation pads,
wherein a region in which the plurality of inter-mediation pads is disposed is divided into a first region and a second region in a first direction,
wherein a first group of inter-mediation pads from among the plurality of inter-mediation pads configured to communicate a data signal is disposed in the first region, and a second group of inter-mediation pads from among the plurality of inter-mediation pads configured to communicate a command and address signal is disposed in the second region.

8. The semiconductor package of claim 7,
wherein a region in which the upper pad is disposed is divided into a third region corresponding to the first region and a fourth region corresponding to the second region in the first direction,
wherein a region in which the external connection terminal is disposed is divided into a fifth region corresponding to the first region and a sixth region corresponding to the second region in a second direction substantially perpendicular to the first direction.

9. The semiconductor package of claim 5, wherein a region in which the external connection terminal is disposed is divided into two regions according to a type of a signal being transmitted.

10. The semiconductor package of claim 5,
wherein the inter-mediation pad is one of a plurality of inter-mediation pads disposed in at least one column in a first direction, and the through electrode is one of a plurality of through electrodes disposed in at least one column in the first direction,
wherein a number of the columns of the plurality of inter-mediation pads is equal to a number of the at least one second semiconductor chip.

11. The semiconductor package of claim 5, wherein the first semiconductor chip comprises at least one of a control region or a cell region.

12. The semiconductor package of claim 5, further comprising:
a support chip disposed between the at least one second semiconductor chip and the package substrate,
wherein the first semiconductor chip is smaller than the at least one second semiconductor chip.

13. The semiconductor package of claim 5, wherein the first semiconductor chip further comprises;
a semiconductor substrate;
a wiring layer disposed on a bottom surface of the semiconductor substrate; and
a connection member disposed on a bottom surface of the wiring layer,
wherein the bottom surface of the semiconductor substrate corresponds to the first surface of the first semiconductor chip, and the through electrode penetrates the semiconductor substrate and is connected to the connection member through the wiring layer.

14. The semiconductor package of claim 5, wherein the first semiconductor chip is a master chip and the at least one second semiconductor chip is a slave chip.

15. A semiconductor package, comprising:
a package substrate;
a first semiconductor chip disposed on the package substrate, wherein an active surface of the first semiconductor chip is connected to the package substrate through a through electrode; and
at least one second semiconductor chip disposed on the first semiconductor chip,
wherein an inactive surface of the at least one second semiconductor chip faces the first semiconductor chip, and the at least one second semiconductor chip is connected to the first semiconductor chip through wire bonding.

16. The semiconductor package of claim 15, wherein the first semiconductor chip comprises:
a semiconductor substrate;
a wiring layer disposed on a bottom surface of the semiconductor substrate;
a connection member disposed on a bottom surface of the wiring layer,
wherein the through electrode is one of a plurality of through electrodes that penetrate the semiconductor substrate,
wherein the through electrodes are disposed in a first direction in a center portion of the semiconductor substrate or in a second direction substantially perpendicular to the first direction;
a plurality of inter-mediation pads disposed in an edge portion of an inactive surface of the first semiconductor chip in the first direction or the second direction;

an upper pad disposed in the inactive surface of the first semiconductor chip in the center portion of the semiconductor substrate, wherein the upper pad is connected to at least one of the through electrodes; and a rewiring line disposed on the inactive surface of the first semiconductor chip and connecting at least one of the inter-mediation pads to the upper pad.

17. The semiconductor package of claim 16, further comprising:

an external connection terminal disposed on a bottom surface of the package substrate, wherein a region in which the external connection terminal is disposed is divided into two regions in the second direction according to a type of a signal being transmitted.

18. The semiconductor package of claim 16, wherein the inter-mediation pads are disposed in at least one column, and the through electrodes are disposed in at least one column, wherein a number of the columns of the inter-mediation pads is equal to a number of the at least one second semiconductor chip.

19. The semiconductor package of claim 16, further comprising:

an external connection terminal disposed on a bottom surface of the package substrate, wherein a region in which the inter-mediation pads are disposed is divided into a first region and a second region in the first direction or the second direction, wherein a region in which the upper pad is disposed is divided into a third region corresponding to the first region and a fourth region corresponding to the second region in the first direction or the second direction, wherein a region in which the external connection terminal is disposed is divided into a. fifth region corresponding to the first region and a sixth region corresponding to the second region in the second direction.

20. The semiconductor package of claim 19, wherein, when the inter-mediation pads and the upper pad are divided in the first direction, first wiring of the package substrate connected to the external connection terminal in the fifth region and second wiring of the package substrate connected to the external connection terminal in the sixth region extend in opposite directions of the first direction.

* * * * *